(12) United States Patent
Ni

(10) Patent No.: US 12,506,401 B2
(45) Date of Patent: Dec. 23, 2025

(54) HYBRID POWER TRANSISTOR APPARATUS AND CONTROL METHOD

(71) Applicant: LEN TECH Inc., Plano, TX (US)

(72) Inventor: Chuan Ni, Plano, TX (US)

(73) Assignee: LEN TECH Inc., Plano, TX (US)

( * ) Notice: Subject to any disclaimer, the term of this patent is extended or adjusted under 35 U.S.C. 154(b) by 219 days.

(21) Appl. No.: 18/389,768

(22) Filed: Dec. 19, 2023

(65) Prior Publication Data

US 2024/0313635 A1  Sep. 19, 2024

Related U.S. Application Data

(63) Continuation-in-part of application No. 18/185,408, filed on Mar. 17, 2023, now Pat. No. 12,413,136.

(51) Int. Cl.
*H02M 3/158* (2006.01)
*H02M 1/00* (2006.01)
*H02M 1/088* (2006.01)
*H03K 17/16* (2006.01)

(52) U.S. Cl.
CPC ......... *H02M 1/088* (2013.01); *H02M 1/0058* (2021.05); *H02M 3/158* (2013.01); *H03K 17/163* (2013.01); *H03K 2217/0063* (2013.01); *H03K 2217/0072* (2013.01)

(58) Field of Classification Search
CPC .... H02M 1/08; H02M 1/0009; H02M 1/0048; H02M 1/44; H02M 1/088; H02M 1/385; H02M 3/158; H03K 17/16; H03K 17/6871; H03K 2217/0063; H03K 2217/0072; H03K 2217/0081
See application file for complete search history.

(56) References Cited

U.S. PATENT DOCUMENTS

| 6,249,111 | B1 * | 6/2001 | Nguyen | H02M 3/1588 323/282 |
| 7,737,666 | B2 * | 6/2010 | Sutardja | H02M 3/1588 323/224 |
| 2003/0038615 | A1 * | 2/2003 | Elbanhawy | H02M 3/1584 323/282 |

(Continued)

FOREIGN PATENT DOCUMENTS

| CN | 109643994 A | * | 4/2019 | ........... H03K 17/122 |
| CN | 115102371 A | * | 9/2022 | ............. H02M 1/08 |
| JP | 2001016083 A | * | 1/2001 | ........... H03K 17/122 |

*Primary Examiner* — Jue Zhang
*Assistant Examiner* — Jye-June Lee
(74) *Attorney, Agent, or Firm* — AP3 Law Firm PLLC

(57) ABSTRACT

A hybrid power transistor apparatus includes a first switching element comprising a first number of transistor cells connected in parallel between a first terminal and a second terminal of the apparatus, wherein gates of the first number of transistor cells are connected together, and the gates of the first number of transistor cells are connected to an output of a first gate drive circuit, and a second switching element comprising a second number of transistor cells connected in parallel between the first terminal and the second terminal of the apparatus, wherein gates of the second number of transistor cells are connected together, and the gates of the second number of transistor cells are connected to an output of a second gate drive circuit, and wherein a delay is placed between the output of the first gate drive circuit and the output of the second gate drive circuit.

20 Claims, 25 Drawing Sheets

(56) References Cited

U.S. PATENT DOCUMENTS

| | | | | |
|---|---|---|---|---|
| 2011/0182446 A1* | 7/2011 | Shajaan | ............... | H02M 3/156 |
| | | | | 327/403 |
| 2012/0092059 A1* | 4/2012 | Li | ........................ | H02M 1/44 |
| | | | | 327/392 |
| 2020/0212809 A1* | 7/2020 | Baranwal | .............. | H02M 1/088 |
| 2023/0402920 A1* | 12/2023 | Edwards | ................ | H02M 1/08 |
| 2023/0421049 A1* | 12/2023 | Neidorff | ............. | H02M 1/0012 |

\* cited by examiner

HYBRID POWER TRANSISTOR APPARATUS AND CONTROL METHOD

PRIORITY CLAIM AND CROSS-REFERENCE

This application is a continuation-in-part of U.S. patent application Ser. No. 18/185,408, filed Mar. 17, 2023, and entitled "Hybrid Power Transistor Apparatus and Control Method," which application is hereby incorporated herein by reference.

TECHNICAL FIELD

The present invention relates to a hybrid power transistor apparatus and control method, and, in particular embodiments, to control methods for reducing switching node ringing in a power conversion system comprising a high-side switch and a low-side switch connected in series.

BACKGROUND

As technologies further advance, a variety of processors such as Digital Signal Processors (DSPs), Field Programmable Gate Arrays (FPGAs), Central Processing Units (CPUs) and/or the like, have become popular. Each processor operates with a low supply voltage (e.g., sub-1V) and consumes a large amount of current. Meanwhile, the input voltage bus has stayed the same (e.g., 12 V) or increased to a higher level (e.g., 48 V) depending on different applications or design needs.

In a high voltage application where a low output voltage is required, two power stages connected in cascaded are traditionally employed to covert the high input voltage into a suitable low voltage fed into the processor. However, this power architecture increases the system cost and complexity.

In order to reduce the system cost and complexity, a processor in the high voltage application may be powered by a power converter. The power converter such as a buck converter includes two power switches connected in series. A first power switch not connected to ground is referred to as a high-side switch. A second power switch connected to ground is referred to as low-side switch. A common node of the high-side switch and the low-side switch is a switching node of the power converter. A low-side gate drive circuit and a high-side gate drive circuit are employed to control the gates of the low-side switch and the high-side switch, respectively. The bias supply of the low-side gate drive circuit is supplied from a regulated bias voltage source. The high-side gate drive circuit may need a gate voltage higher than the voltage of the input power source connected to the power converter.

The low-side switch and the high-side switch may be implemented as metal oxide semiconductor field effect transistors (MOSFET). MOSFETs are voltage-controlled devices. When a gate drive voltage is applied to the gate of a MOSFET, and the gate drive voltage is greater than the turn-on threshold of the MOSFET, a conductive channel is established between the drain and the source of the MOSFET. After the conductive channel has been established, the MOSFET is in an on state in which power flows between the drain and the source of the MOSFET. On the other hand, when the gate drive voltage applied to the gate is less than the turn-on threshold of the MOSFET, the MOSFET is turned off accordingly.

In operation, the turn-on and turn-off of the power switches cause a variety of issues. For example, a fast turn-on of the high-side switch generates the parasitic inductance on the current path. The depletion of the charge in the body diode of the low-side switch functions as a capacitor. The low Rdson of the high-side switch, the parasitic inductance and the capacitor form a high Q LC circuit. This high Q LC circuit may generate significant voltage overshoots and under-damped ringing on the switching node, thereby causing Electromagnetic interference (EMI) issues. The under-damped ringing requires a longer blanking time for the current detector circuit, which detects the current flowing through the high-side switch. Furthermore, the fast turn-on of the power switch may cause voltage spikes that can damage the power switch. In order to overcome the voltage spikes, higher voltage rating MOSFETs have to be used. The higher voltage rating MOSFETs increase the system cost. The issues above can be resolved through reducing the slew rate of the switching node voltage. However, a reduced slew rate of the switching node voltage may increase the switching losses of the power switch. The switching losses increase with frequency. As a result, this solution sacrifices efficiency in high frequency operation (e.g., over 1 MHz). Furthermore, in the high voltage to low voltage conversion application, the turn-on pulse of the high-side switch is very narrow. The ringing on the switching node may prevent the current detection circuit from operating correctly without a longer blanking time. Since the turn-on pulse of the high-side switch is very narrow, the blanking time may be longer than the turn-on time of the high-side switch. Under this operating condition, the current detection circuit cannot accurately detect the current flowing through the high-side switch. It would be desirable to have a simple and reliable control method to reduce the ringing on the switching node so as to resolve the various issues described above, thereby providing reliable power to the processor.

SUMMARY

These and other problems are generally solved or circumvented, and technical advantages are generally achieved, by preferred embodiments of the present disclosure which provide a hybrid power transistor apparatus and control method for reducing switching node ringing in a power conversion system comprising a high-side switch and a low-side switch connected in series.

In accordance with an embodiment, an apparatus comprises a first switching element comprising a first number of transistor cells connected in parallel between a first terminal and a second terminal of the apparatus, wherein gates of the first number of transistor cells are connected together, and the gates of the first number of transistor cells are configured to be connected to an output of a first gate drive circuit, and a second switching element comprising a second number of transistor cells connected in parallel between the first terminal and the second terminal of the apparatus, wherein gates of the second number of transistor cells are connected together, and the gates of the second number of transistor cells are configured to be connected to an output of a second gate drive circuit, and wherein a delay is placed between the output of the first gate drive circuit and the output of the second gate drive circuit.

In accordance with another embodiment, a method comprises turning off a first switching element of a low-side switch, with a first delay after turning off the first switching element of the low-side switch, turning off a second switching element of the low-side switch, turning on a second switching element of a high-side switch, and with a second delay after turning on the second switching element of the high-side switch, turning on a first switching element of the high-side switch.

In accordance with yet another embodiment, a system comprises a high-side switch and a low-side switch connected in series between a first voltage bus and a second voltage bus, wherein the high-side switch comprises a first high-side switching element comprising a first number of high-side transistor cells connected in parallel, and a second high-side switching element comprising a second number of high-side transistor cells connected in parallel, and the low-side switch comprises a first low-side switching element comprising a first number of low-side transistor cells connected in parallel, and a second low-side switching element comprising a second number of low-side transistor cells connected in parallel, a first high-side driver configured to provide a first high-side drive signal for the first number of high-side transistor cells in the first high-side switching element, a second high-side driver configured to provide a second high-side drive signal for the second number of high-side transistor cells in the second high-side switching element, a first low-side driver configured to provide a first low-side drive signal for the first number of low-side transistor cells in the first low-side switching element, and a second low-side driver configured to provide a second low-side drive signal for the second number of low-side transistor cells in the second low-side switching element.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a hybrid power transistor apparatus and control method for reducing switching node ringing in a power conversion system comprising a high-side switch and a low-side switch connected in series. The disclosure may also be applied, however, to a variety of power conversion systems. Hereinafter, various embodiments will be explained in detail with reference to the accompanying drawings.

Figure 1:
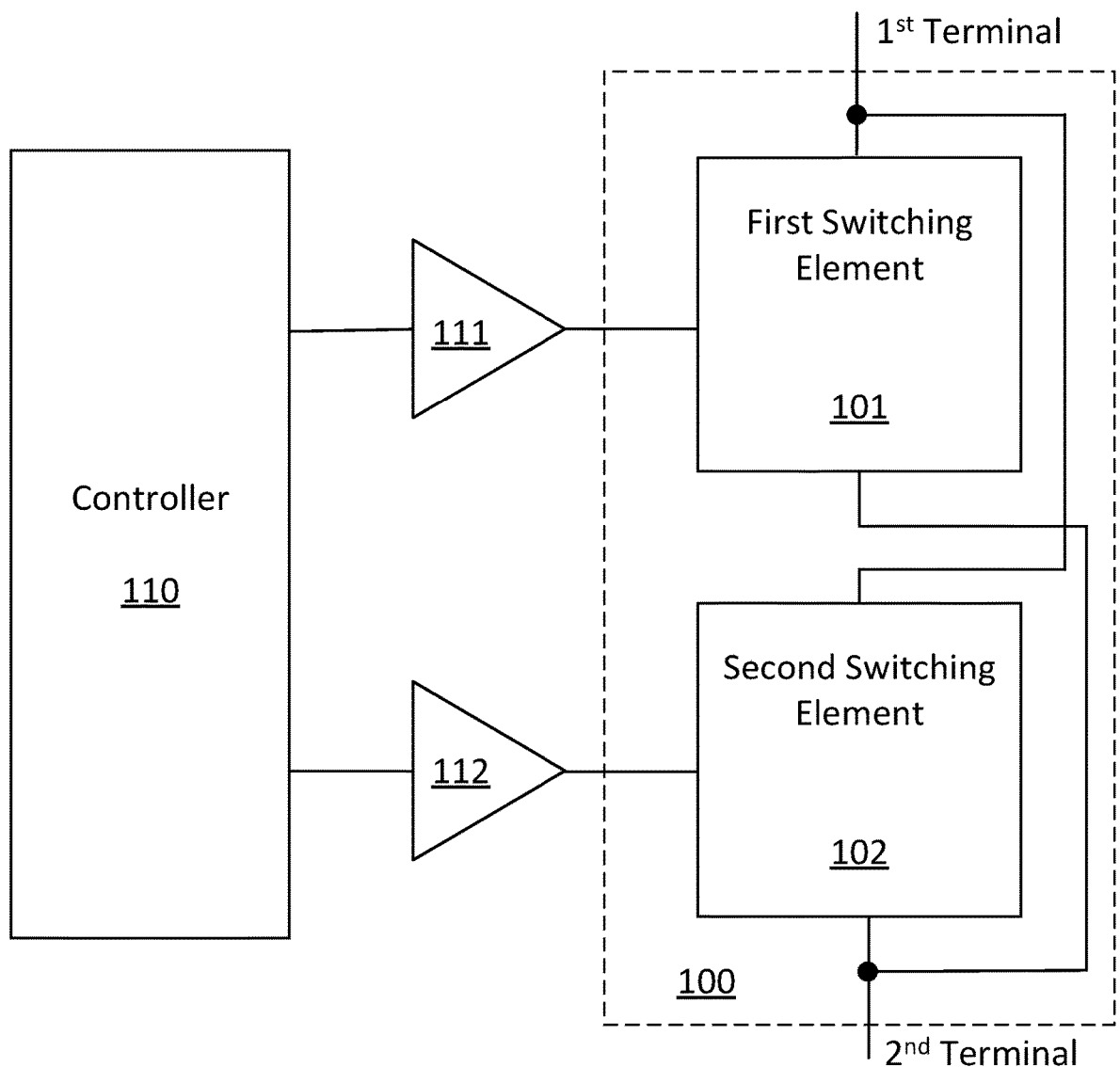
FIG. 1 illustrates a block diagram of a hybrid power transistor apparatus in accordance with various embodiments of the present disclosure.

FIG. 1 illustrates a block diagram of a hybrid power transistor apparatus in accordance with various embodiments of the present disclosure. The hybrid power transistor apparatus 100 comprises a first switching element 101 and a second switching element 102. In some embodiments, the first switching element 101 and the second switching element 102 are integrated in a semiconductor package having a first terminal, a second terminal, a first gate terminal and a second gate terminal.

The first switching element 101 comprises a first number of transistor cells connected in parallel between the first terminal and the second terminal of the hybrid power transistor apparatus 100. The gates of the first number of transistor cells are connected together. As shown in FIG. 1, the gates of the first number of transistor cells of the first switching element 101 are configured to be connected to an output of a first gate drive circuit 111.

The second switching element 102 comprises a second number of transistor cells connected in parallel between the first terminal and the second terminal of the hybrid power transistor apparatus 100. The gates of the second number of transistor cells are connected together. As shown in FIG. 1, the gates of the second number of transistor cells of the second switching element 102 are configured to be connected to an output of a second gate drive circuit 112. In some embodiments, a delay is placed between the output of the first gate drive circuit and the output of the second gate drive circuit. In other words, the first switching element 101 and the second switching element 102 are not turned on/off simultaneously.

In some embodiments, the first terminal shown in FIG. 1 is a drain terminal of the hybrid power transistor apparatus. The second terminal shown in FIG. 1 is a source terminal of the hybrid power transistor apparatus. The drain terminal is connected to drains of the first number of transistor cells of the first switching element 101 and drains of the second number of transistor cells of the second switching element 102. The source terminal is connected to sources of the first number of transistor cells and sources of the second number of transistor cells.

The controller 110 is configured to generate gate drive signals for the first switching element 101 and the second switching element 102. Furthermore, the controller 110 is configured to control the operation of the first switching element 101 and the second switching element 102 based on a plurality of operating parameters. In particular, the controller 110 is configured to generate gate drive signals for configuring the first switching element 101 and the second switching element 102 such that one switching element (e.g., the second switching element 102) functions as a large resistor during an on/off transition. Such a large resistor helps to attenuate the ringing on the switching node (a common node of a high-side switch and a low-side switch). The detailed operation principle of the controller 110 will be described below with respect to FIGS. 4-8.

In some embodiments, the first switching element 101 and the second switching element 102 may be configured as a high-side switch connected in series with a low-side switch between a first voltage bus and a second voltage bus. Under this configuration, the number of the transistor cells of the first switching element 101 is greater than the number of the transistor cells of the second switching element 102. In operation, the second switching element 102 is turned on once the low-side switch is turned off. The first switching element 101 is turned on with a predetermined delay (e.g., 10 nanoseconds) after the low-side switch is turned off.

An early turn-on of the second switching element 102 is configured to attenuate an inductor-capacitor (LC) oscillation voltage occurred on a common node of the high-side switch and the low-side switch.

In some embodiments, the first switching element 101 and the second switching element 102 may be configured as a low-side switch connected in series with a high-side switch between a first voltage bus and a second voltage bus. Under this configuration, the number of the transistor cells of the first switching element 101 is greater than the number of the transistor cells of the second switching element 102. In operation, the second switching element 102 remains on after the first switching element 101 is turned off. At least one portion of the high-side switch is turned on once the second switching element is turned off.

A delayed turn-off of the second switching element 102 is configured to prevent a body diode of the low-side switch from conducting during a dead time ranging from a turn-off time instant of the first switching element 101 to a turn-on time instant of the at least portion of the high-side switch.

Figure 2:
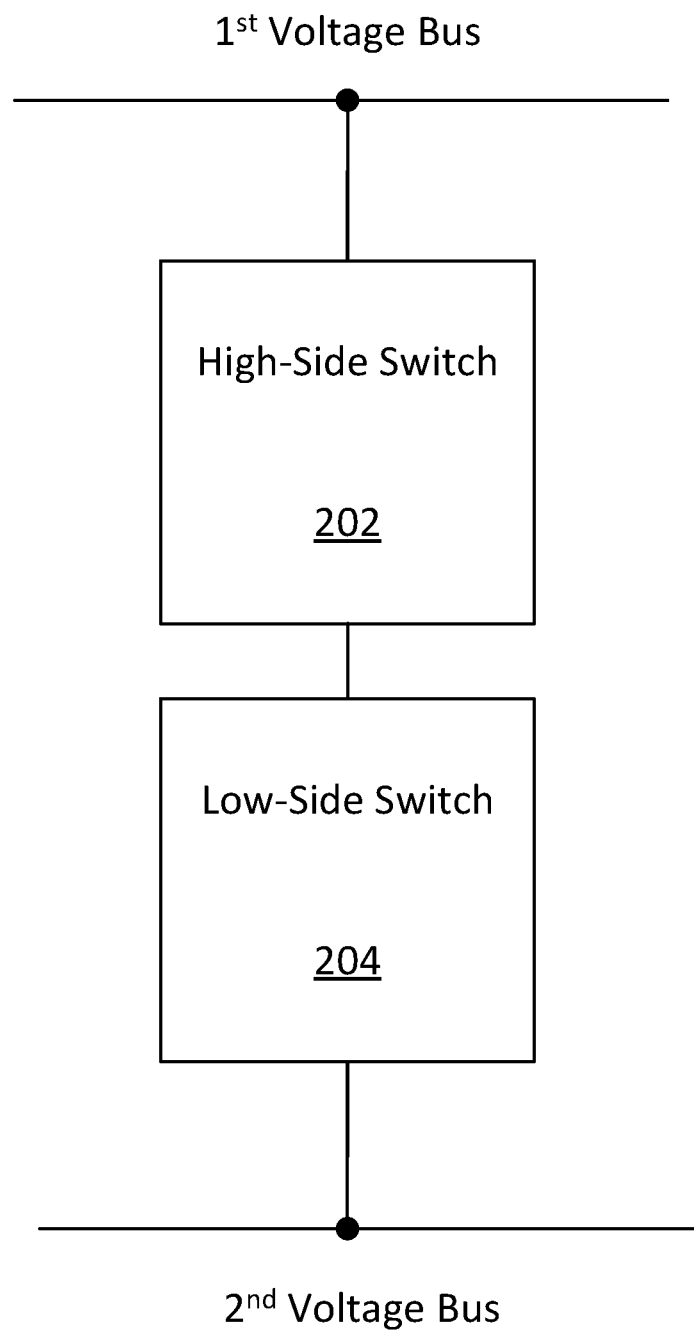
FIG. 2 illustrates a block diagram of a power conversion system comprising a high-side switch and a low-side switch connected in series in accordance with various embodiments of the present disclosure.

FIG. 2 illustrates a block diagram of a power conversion system comprising a high-side switch and a low-side switch connected in series in accordance with various embodiments of the present disclosure. As shown in FIG. 2, a high-side switch 202 and a low-side switch 204 are connected in series between a first voltage bus and a second voltage bus. In some embodiments, the high-side switch 202 and a low-side switch 204 may be part of a step-down power converter. In alternative embodiments, the high-side switch 202 and a low-side switch 204 may be part of other suitable power conversion systems such as a full-bridge power converter, a half-bridge power converter, a motor driver and the like.

In some embodiments, the highs-side switch 202 is formed by the hybrid power transistor apparatus shown in FIG. 1. In particular, the high-side switch 202 comprises a first high-side switching element comprising a first number of high-side transistor cells connected in parallel, and a second high-side switching element comprising a second number of high-side transistor cells connected in parallel. The detailed structure of the high-side switch 202 will be described below with respect to FIG. 3.

In some embodiments, the low-side switch 204 is formed by the hybrid power transistor apparatus shown in FIG. 1. In particular, the low-side switch 204 comprises a first low-side switching element comprising a first number of low-side transistor cells connected in parallel, and a second low-side switching element comprising a second number of low-side transistor cells connected in parallel. The detailed structure of the low-side switch 204 will be described below with respect to FIG. 3.

Figure 3:
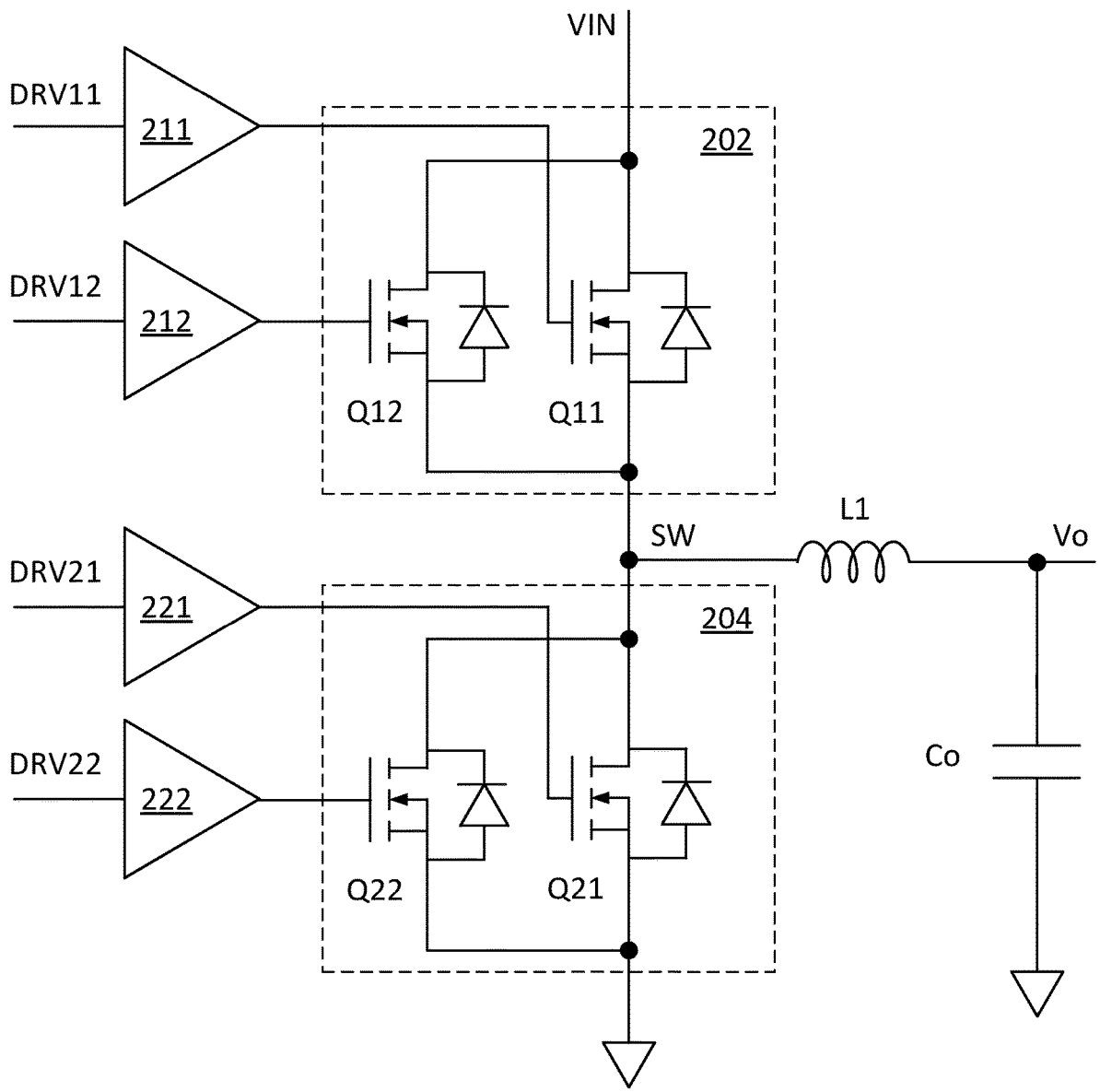
FIG. 3 illustrates a schematic diagram of a step-down converter formed by the hybrid power transistor apparatus shown in FIG. 1 in accordance with various embodiments of the present disclosure.

FIG. 3 illustrates a schematic diagram of a step-down converter formed by the hybrid power transistor apparatus shown in FIG. 1 in accordance with various embodiments of the present disclosure. The step-down converter comprises a high-side switch 202 and a low-side switch 204 connected in series between the input voltage bus VIN and ground. The step-down converter further comprises an inductor L1 connected between a common node of the high-side switch 202 and the low-side switch 204, and an output bus Vo of the step-down converter. The common node of the high-side switch 202 and the low-side switch 204 is also known as a switching node (SW) of the step-down converter.

In some embodiments, the high-side switch 202 is implemented as the hybrid power transistor apparatus 100 shown in FIG. 1. As shown in FIG. 3, the high-side switch 202 comprises a first high-side switching element Q11 and a second high-side switching element Q12 connected in parallel between VIN and the switching node SW. The first high-side switching element Q11 comprises a first number of high-side transistor cells connected in parallel. The second high-side switching element Q12 comprises a second number of high-side transistor cells connected in parallel. In some embodiments, the first number is greater than the second number. The on resistance of the first high-side switching element Q11 is 15 milliohms. The on resistance of the second high-side switching element Q12 is 100 milliohms.

In some embodiments, the low-side switch 204 is implemented as the hybrid power transistor apparatus 100 shown in FIG. 1. As shown in FIG. 3, the low-side switch 204 comprises a first low-side switching element Q21 and a second low-side switching element Q22 connected in parallel between the switching node SW and ground. The first low-side switching element Q21 comprises a first number of low-side transistor cells connected in parallel. The second low-side switching element Q22 comprises a second number of low-side transistor cells connected in parallel. In some embodiments, the first number is greater than the second number. The on resistance of the first low-side switching element Q21 is 15 milliohms. The on resistance of the second low-side switching element Q22 is 100 milliohms.

A controller (not shown) is configured to generate gate drive signals DRV11, DRV12, DRV21 and DRV22 for the high-side switch 202 and the low-side switch 204. As shown in FIG. 3, a first high-side driver 211 is configured to receive the first high-side drive signal DRV11 and provide DRV11 for the first number of high-side transistor cells in the first high-side switching element Q11. A second high-side driver 212 is configured to receive the second high-side drive signal DRV12 and provide DRV12 for the second number of high-side transistor cells in the second high-side switching element Q12. A first low-side driver 221 is configured to receive the first low-side drive signal DRV21 and provide DRV21 for the first number of low-side transistor cells in the first low-side switching element Q21. A second low-side driver 222 is configured to receive the second low-side drive signal DRV22 and provide DRV22 for the second number of low-side transistor cells in the second low-side switching element Q22.

In operation, during a turn-on process of the high-side switch 202, the second low-side switching element Q22 remains on in a first delay counting from a turn-off instant of the first low-side switching element Q21. The first high-side switching element Q11 is turned on after a second delay counting from a turn-on instant of the second high-side switching element Q12.

In an embodiment of the turn-on process of the high-side switch 202, the second high-side switching element Q12 is turned on once the second low-side switching element Q22 is turned off. The detailed operating principle of this gate drive control scheme will be described below with respect to FIG. 4.

In another embodiment of the turn-on process of the high-side switch 202, a predetermined dead time is placed between the turn-off of the second low-side switching element Q22 and the turn-on of the second high-side switching element Q12. The detailed operating principle of this gate drive control scheme will be described below with respect to FIG. 5.

In yet another embodiment of the turn-on process of the high-side switch 202, a predetermined overlap is placed between the turn-on of the second low-side switching element Q22 and the turn-on of the second high-side switching element Q12. In other words, in the predetermined overlap, both the second low-side switching element Q22 and the second high-side switching element Q12 are in the on state simultaneously. The detailed operating principle of this gate drive control scheme will be described below with respect to FIG. 6.

During a turn-on process of the low-side switch, the second high-side switching element Q12 remains on in a third delay counting from a turn-off instant of the first high-side switching element Q11. Both the first low-side switching element Q21 and the second low-side switching element Q22 are turned on simultaneously.

In an embodiment of the turn-on process of the low-side switch 204, a predetermined overlap is placed between the turn-on of the low-side switch 204 and the turn-on of the second high-side switching element Q12. In other words, in the predetermined overlap, both the low-side switch 204 and the second high-side switching element Q12 are in the on state simultaneously. The detailed operating principle of this gate drive control scheme will be described below with respect to FIG. 7.

In another embodiment of the turn-on process of the low-side switch 204, the low-side switch 204 is turned on once the second high-side switching element Q12 is turned off. The detailed operating principle of this gate drive control scheme will be described below with respect to FIG. 8.

It should be noted that the diagram shown in FIG. 3 is merely an example, which should not unduly limit the scope of the claims. One of ordinary skill in the art would recognize many variations, alternatives, and modifications.

For example, the high-side switch 202 and the low-side switch 204 may be one leg of a full-bridge converter.

In accordance with an embodiment, the switches of FIG. 3 (e.g., switches Q11, Q12, Q21 and Q22) may be metal oxide semiconductor field-effect transistor (MOSFET) devices. Alternatively, the switches can be any controllable switches such as insulated gate bipolar transistor (IGBT) devices, integrated gate commutated thyristor (IGCT) devices, gate turn-off thyristor (GTO) devices, silicon-controlled rectifier (SCR) devices, junction gate field-effect transistor (JFET) devices, MOS controlled thyristor (MCT) devices, gallium nitride (GaN) based power devices, silicon carbide (SiC) based power devices and the like.

It should be noted while FIG. 3 shows the switches Q11, Q12, Q21 and Q22 are implemented as single n-type transistors, a person skilled in the art would recognize there may be many variations, modifications and alternatives. For example, depending on different applications and design needs, at least some of the switches (e.g., Q11 and Q12) may be implemented as p-type transistors. Furthermore, each switch shown in FIG. 3 may be implemented as a plurality of switches connected in parallel. Moreover, a capacitor may be connected in parallel with one switch to achieve zero voltage switching (ZVS)/zero current switching (ZCS).

Figure 4:
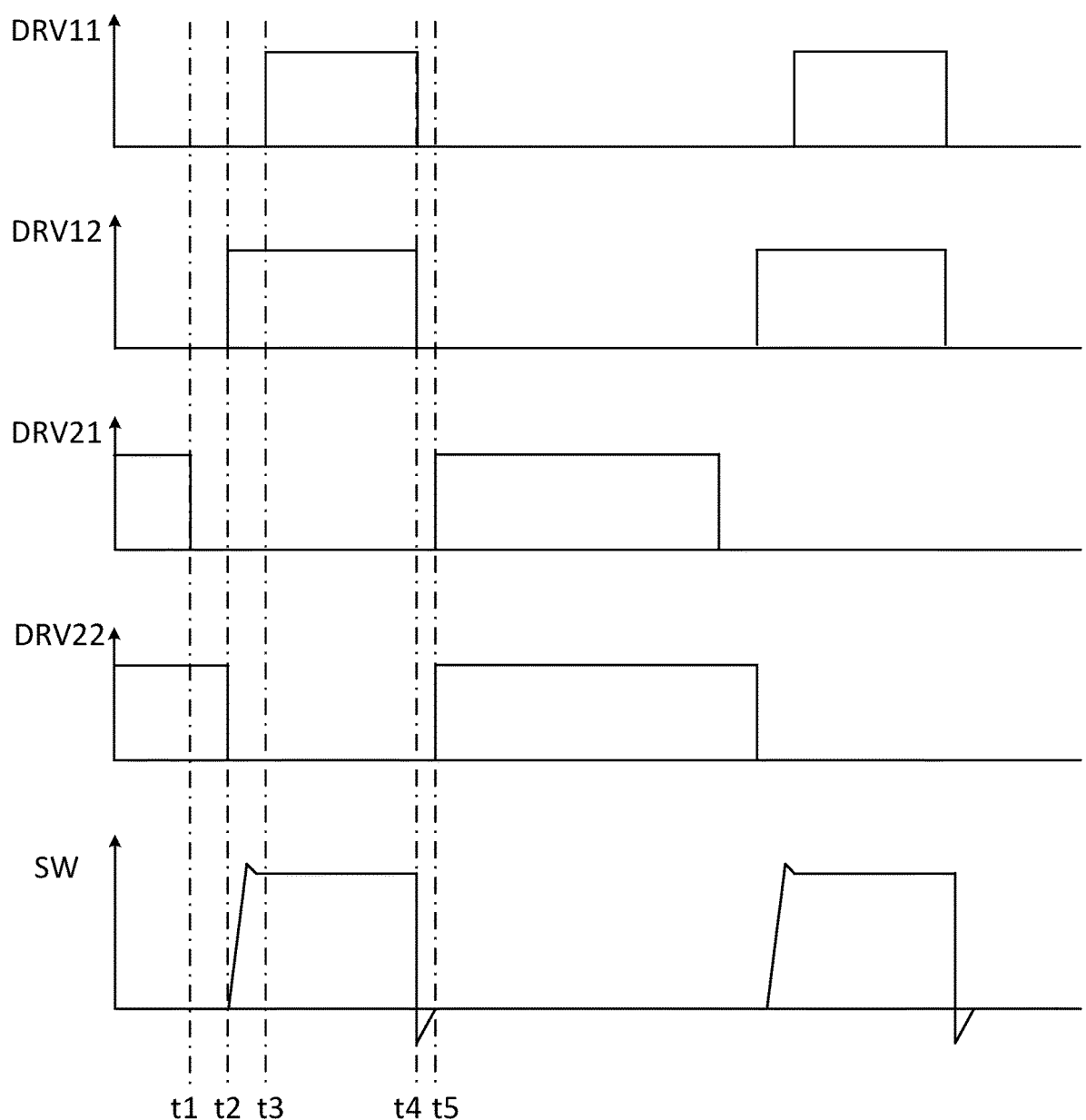
FIG. 4 illustrates a first implementation of the gate drive control scheme applied to the step-down converter shown in FIG. 3 in accordance with various embodiments of the present disclosure.

FIG. 4 illustrates a first implementation of the gate drive control scheme applied to the step-down converter shown in FIG. 3 in accordance with various embodiments of the present disclosure. The horizontal axis of FIG. 4 represents intervals of time. There may be five rows in FIG. 4. The first row represents the gate drive signal of the first high-side switching element. The second row represents the gate drive signal of the second high-side switching element. The third row represents the gate drive signal of the first low-side switching element. The fourth row represents the gate drive signal of the second low-side switching element. The fifth row represents the voltage on the switching node.

Referring back to FIG. 3, the high-side switch 202 comprises a first high-side switching element Q11 comprising a first number of high-side transistor cells connected in parallel, and a second high-side switching element Q12 comprising a second number of high-side transistor cells connected in parallel. The low-side switch 204 comprises a first low-side switching element Q21 comprising a first number of low-side transistor cells connected in parallel, and a second low-side switching element Q22 comprising a second number of low-side transistor cells connected in parallel.

As shown in FIG. 4, prior to t1, both the first low-side switching element Q21 and the second low-side switching element Q22 of the low-side switch are in a turn-on state. In response to a turn-on command of the high-side switch, the first low-side switching Q21 is turned off at t1. After a first predetermined delay (from t1 to t2), the second low-side switching element Q22 is turned off at t2. At t2, the second high-side switching element Q12 is turned on. In response to the turn-off of the second low-side switching element Q22 and the turn-on of the second high-side switching element Q12, the voltage on the switching node rises from zero to a voltage equal to the input voltage. After a second predetermined delay (from t2 to t3), the first high-side switching element Q11 is turned on at t3.

As shown in FIG. 4, the turn-on of the second low-side switching element Q22 from t1 to t2 and the turn-on of the second high-side switching element Q12 from t2 to t3 helps to eliminate the dead time between conduction periods of two switches connected in series. Eliminating or at least reducing dead time helps to improve the efficiency of the step-down converter.

The high-side switch is fully turned on from t3. From t3 to t4, both the first high-side switching element Q11 and the second high-side switching element Q12 of the low-side switch are in a turn-on state. At t4, in response to a turn-on command of the low-side switch, both the first high-side switching element Q11 and the second high-side switching element Q12 of the high-side switch are turned off. After a predetermined dead time (from t4 to t5), both the first low-side switching element Q21 and the second low-side switching element Q22 of the low-side switch are turned on at t5.

One advantageous feature of the gate drive control scheme shown in FIG. 4 is that the switching node ringing can be significantly reduced. From t2 to t3, the second high-side switching element Q12 functions as a large resistor (e.g., 1 ohm for p-type MOSFETs). Such a large resistor functions as a damping resistor configured to effectively attenuate the oscillation caused by the parasitic inductances and capacitances of the switches, thereby reducing the ringing on the switching node.

Another advantageous feature of the gate drive control scheme shown in FIG. 4 is that the turn-on of the second low-side switching element Q22 from t1 to t2 helps to prevent the body diode of the low-side switch from conducting, thereby improving the efficiency of the step-down converter.

Figure 5:
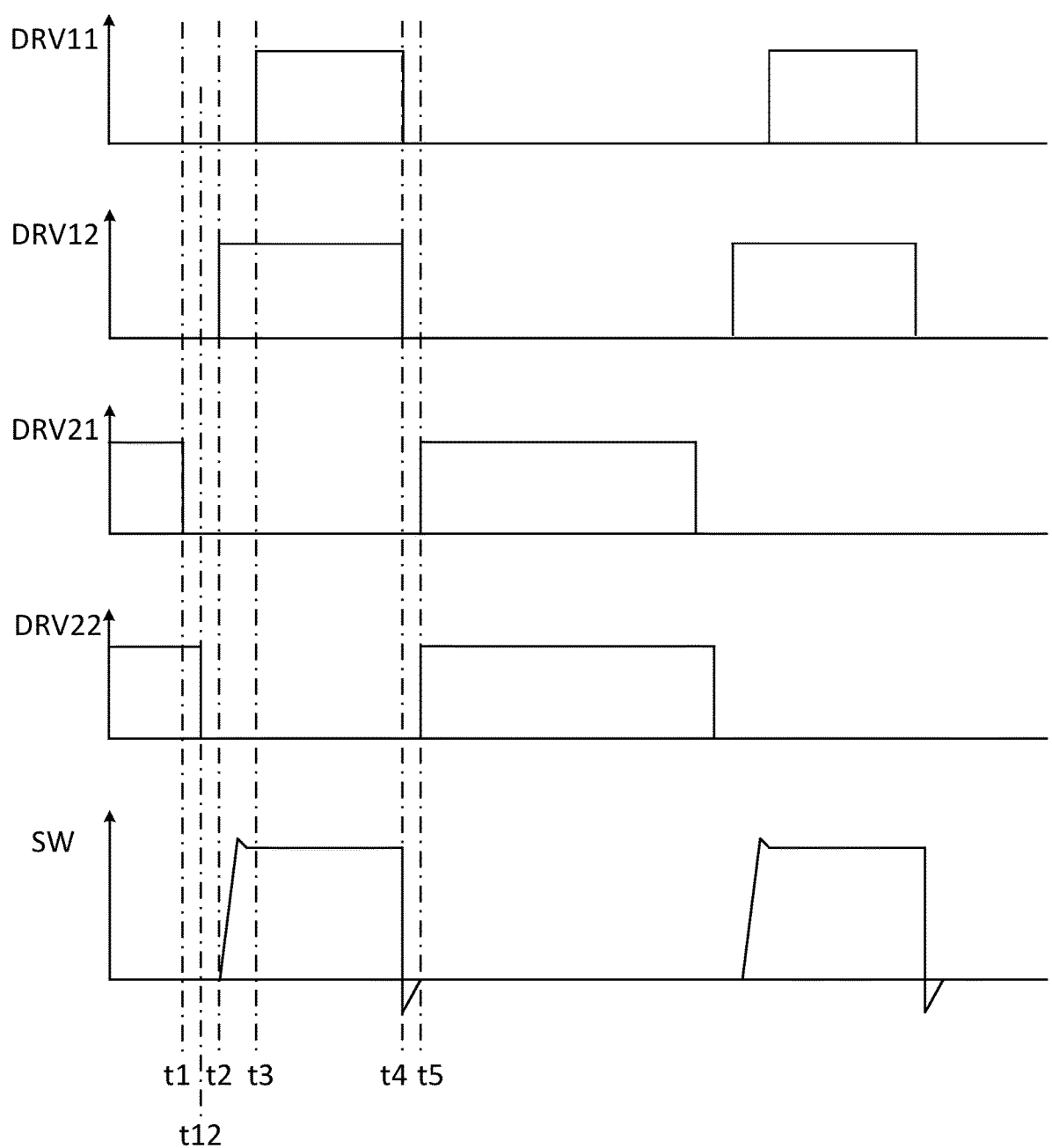
FIG. 5 illustrates a second implementation of the gate drive control scheme applied to the step-down converter shown in FIG. 3 in accordance with various embodiments of the present disclosure.

FIG. 5 illustrates a second implementation of the gate drive control scheme applied to the step-down converter shown in FIG. 3 in accordance with various embodiments of the present disclosure. There may be five rows in FIG. 5. The first row represents the gate drive signal of the first high-side switching element. The second row represents the gate drive signal of the second high-side switching element. The third row represents the gate drive signal of the first low-side switching element. The fourth row represents the gate drive signal of the second low-side switching element. The fifth row represents the voltage on the switching node.

Prior to t1, both the first low-side switching element Q21 and the second low-side switching element Q22 of the low-side switch are in a turn-on state. In response to a turn-on command of the highs-side switch, the first low-side switching element Q21 is turned off at t1. After a first predetermined delay (from t1 to t12), the second low-side switching element Q22 is turned off at t12. After a predetermined dead time (from t12 to t2), the second high-side switching element Q12 is turned on at t2. In response to the turn-on of the second high-side switching element Q12, the voltage on the switching node rises from zero to a voltage equal to the input voltage. After a second predetermined delay (from t2 to t3), the first high-side switching element Q11 is turned on at t3.

The high-side switch is fully turned on from t3. From t3 to t4, both the first high-side switching element Q11 and the second high-side switching element Q12 of the high-side switch are in a turn-on state. At t4, in response to a turn-on command of the low-side switch, both the first high-side switching element Q11 and the second high-side switching element Q12 of the high-side switch are turned off. After another predetermined dead time (from t4 to t5), both the first low-side switching element Q21 and the second low-side switching element Q22 of the low-side switch are turned on at t5.

Figure 6:
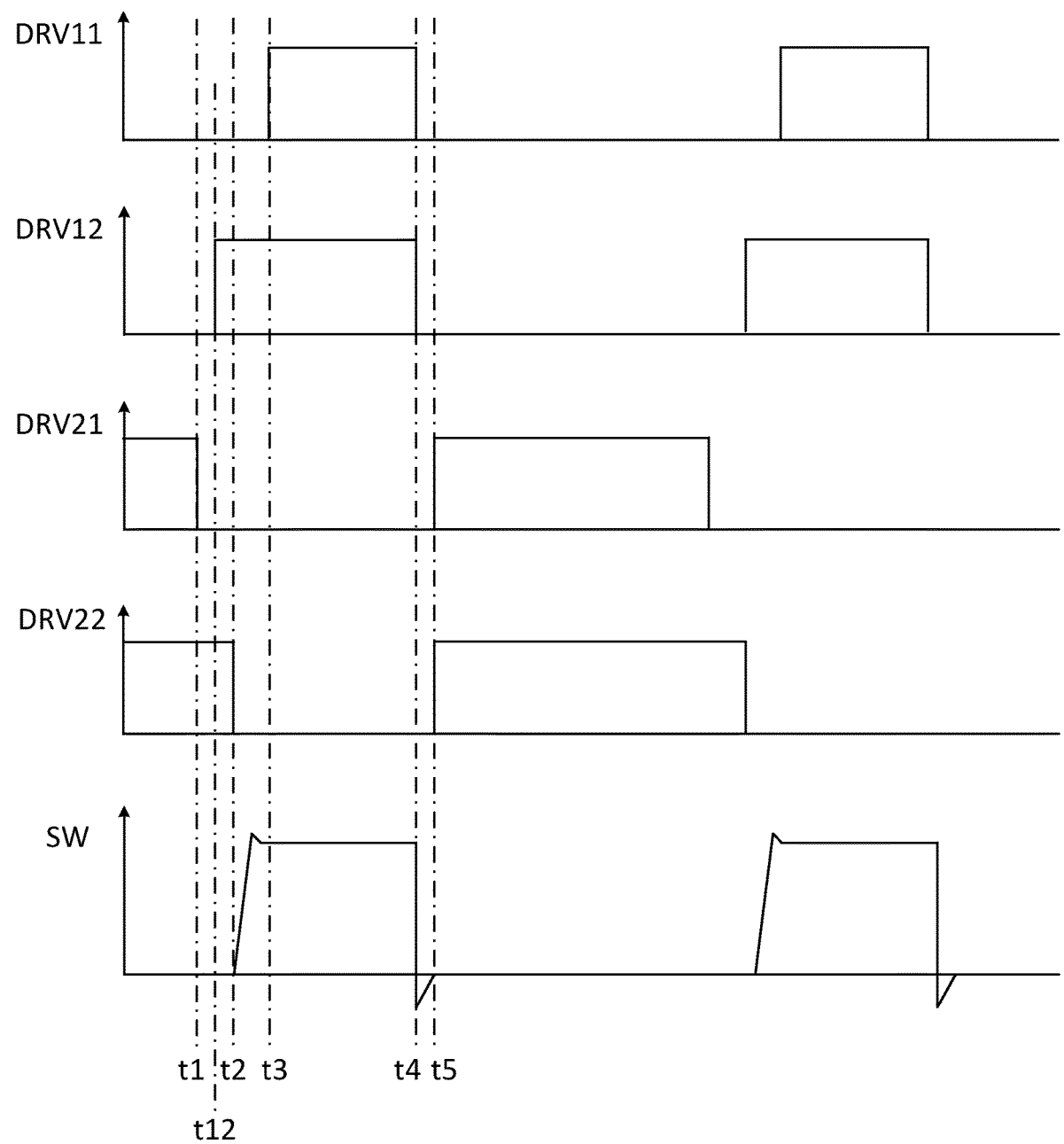
FIG. 6 illustrates a third implementation of the gate drive control scheme applied to the step-down converter shown in FIG. 3 in accordance with various embodiments of the present disclosure.

FIG. 6 illustrates a third implementation of the gate drive control scheme applied to the step-down converter shown in FIG. 3 in accordance with various embodiments of the present disclosure. There may be five rows in FIG. 6. The first row represents the gate drive signal of the first high-side switching element. The second row represents the gate drive signal of the second high-side switching element. The third row represents the gate drive signal of the first low-side switching element. The fourth row represents the gate drive signal of the second low-side switching element. The fifth row represents the voltage on the switching node.

Prior to t1, both the first low-side switching element Q21 and the second low-side switching element Q22 of the low-side switch are in a turn-on state. In response to a turn-on command of the highs-side switch, the first low-side switching Q21 is turned off at t1. After a first predetermined delay (from t1 to t12), the second high-side switching element Q12 is turned on at t12, and the second low-side switching element Q22 remains on at t12. From t12 to t2, both the second low-side switching element Q22 and the second high-side switching element Q12 are in the on state simultaneously. At t2, the second low-side switching element Q22 is turned off. In response to the turn-off of the second low-side switching element Q22 and the turn-on of the second high-side switching element Q12, the voltage on the switching node rises from zero to a voltage equal to the input voltage. After a second predetermined delay (from t2 to t3), the first high-side switching element Q11 is turned on at t3.

The high-side switch is fully turned on from t3. From t3 to t4, both the first high-side switching element Q11 and the second high-side switching element Q12 of the high-side switch are in a turn-on state. At t4, in response to a turn-on command of the low-side switch, both the first high-side switching element Q11 and the second high-side switching element Q12 of the high-side switch are turned off. After a predetermined dead time (from t4 to t5), both the first low-side switching element Q21 and the second low-side switching element Q22 of the low-side switch are turned on at t5.

Figure 7:
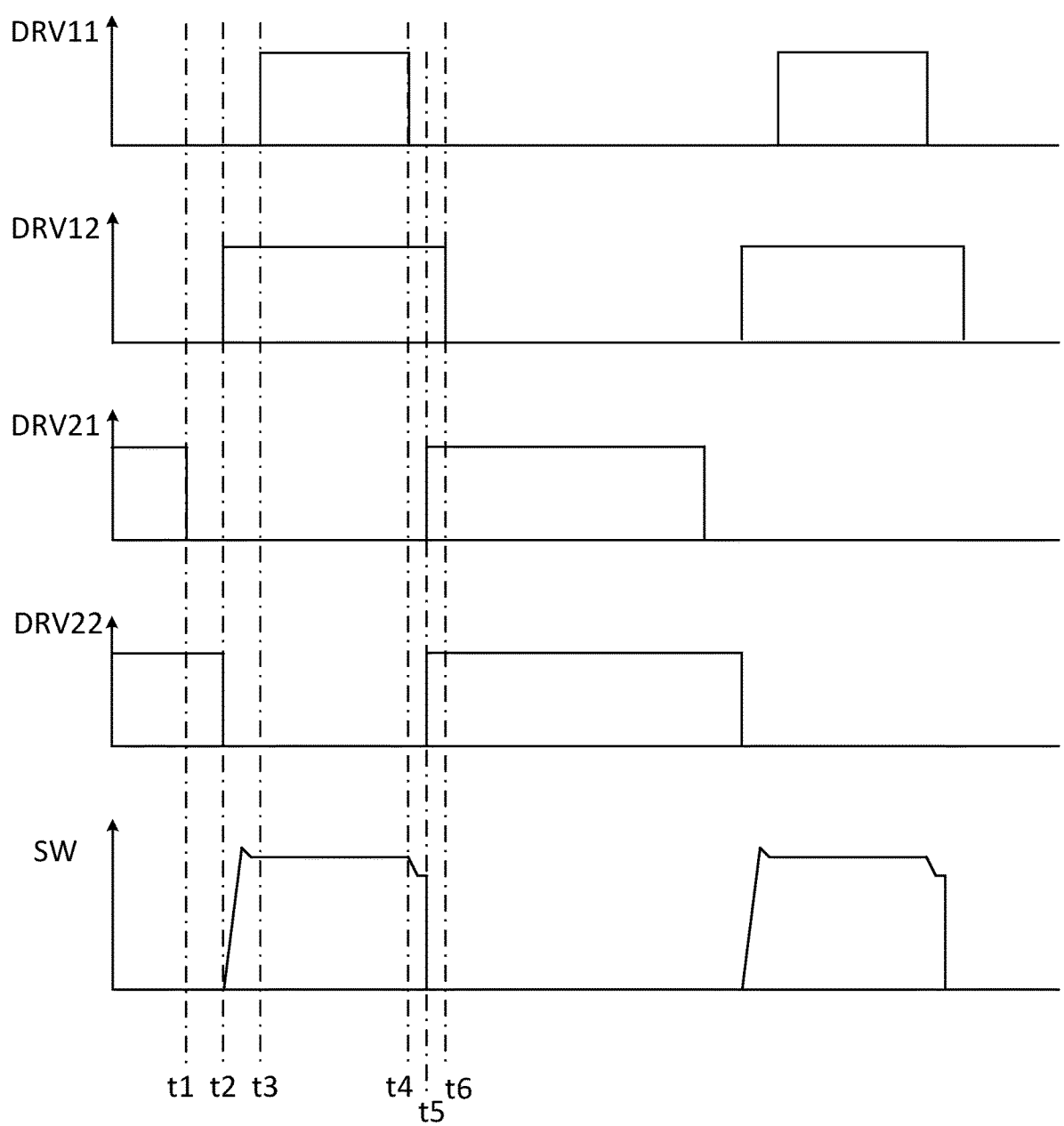
FIG. 7 illustrates a fourth implementation of the gate drive control scheme applied to the step-down converter shown in FIG. 3 in accordance with various embodiments of the present disclosure.

FIG. 7 illustrates a fourth implementation of the gate drive control scheme applied to the step-down converter shown in FIG. 3 in accordance with various embodiments of the present disclosure. There may be five rows in FIG. 7. The first row represents the gate drive signal of the first high-side switching element. The second row represents the gate drive signal of the second high-side switching element. The third row represents the gate drive signal of the first low-side switching element. The fourth row represents the gate drive signal of the second low-side switching element. The fifth row represents the voltage on the switching node.

Prior to t1, both the first low-side switching element Q21 and the second low-side switching element Q22 of the low-side switch are in a turn-on state. In response to a turn-on command of the highs-side switch, the first low-side switching element Q21 is turned off at t1. After a first predetermined delay (from t1 to t2), the second low-side switching element Q22 is turned off at t2. At t2, the second high-side switching element Q12 is turned on. In response to the turn-off of the second low-side switching element Q22 and the turn-on of the second high-side switching element Q12, the voltage on the switching node rises from zero to a voltage equal to the input voltage. After a second predetermined delay (from t2 to t3), the first high-side switching element Q11 is turned on at t3.

The high-side switch is fully turned on from t3. From t3 to t4, both the first high-side switching element Q11 and the second high-side switching element Q12 of the low-side switch are in a turn-on state. At t4, in response to a turn-on command of the low-side switch, the first high-side switching element Q11 is turned off. At t5, the low-side switch (Q21 and Q22) is turned on. After a predetermined delay, the second high-side switching element Q12 is turned off at t6. As shown in FIG. 7, from t5 to t6, both the low-side switch and the second high-side switching element Q12 are in an on state. From t4 to t6, the second high-side switching element Q12 remains on during the turn-on transition of the low-side switch. Such a turn-on transition prevents the body diode of the low-side switch from conducting. As a result, the negative voltage on the switching node caused by the body diode conduction does not occur in FIG. 7.

One advantageous feature of the gate drive control scheme shown in FIG. 7 is that the turn-on transition shown in FIG. 7 prevents the negative voltage on the switching node from occurring. As a result, some circuit protection function blocks such as guard rings can be saved, thereby reducing the cost of the switches.

The turn-on transition of the low-side switch shown in FIG. 7 is used in combination with the turn-on transition of the high-side switch shown in FIG. 4. A person skilled in the art would understand this combination is merely an example. Depending on different applications and design needs, the turn-on transition of the low-side switch shown in FIG. 7 can be used in combination with the turn-on transitions of the high-side switch shown in FIGS. 5-6.

Figure 8:
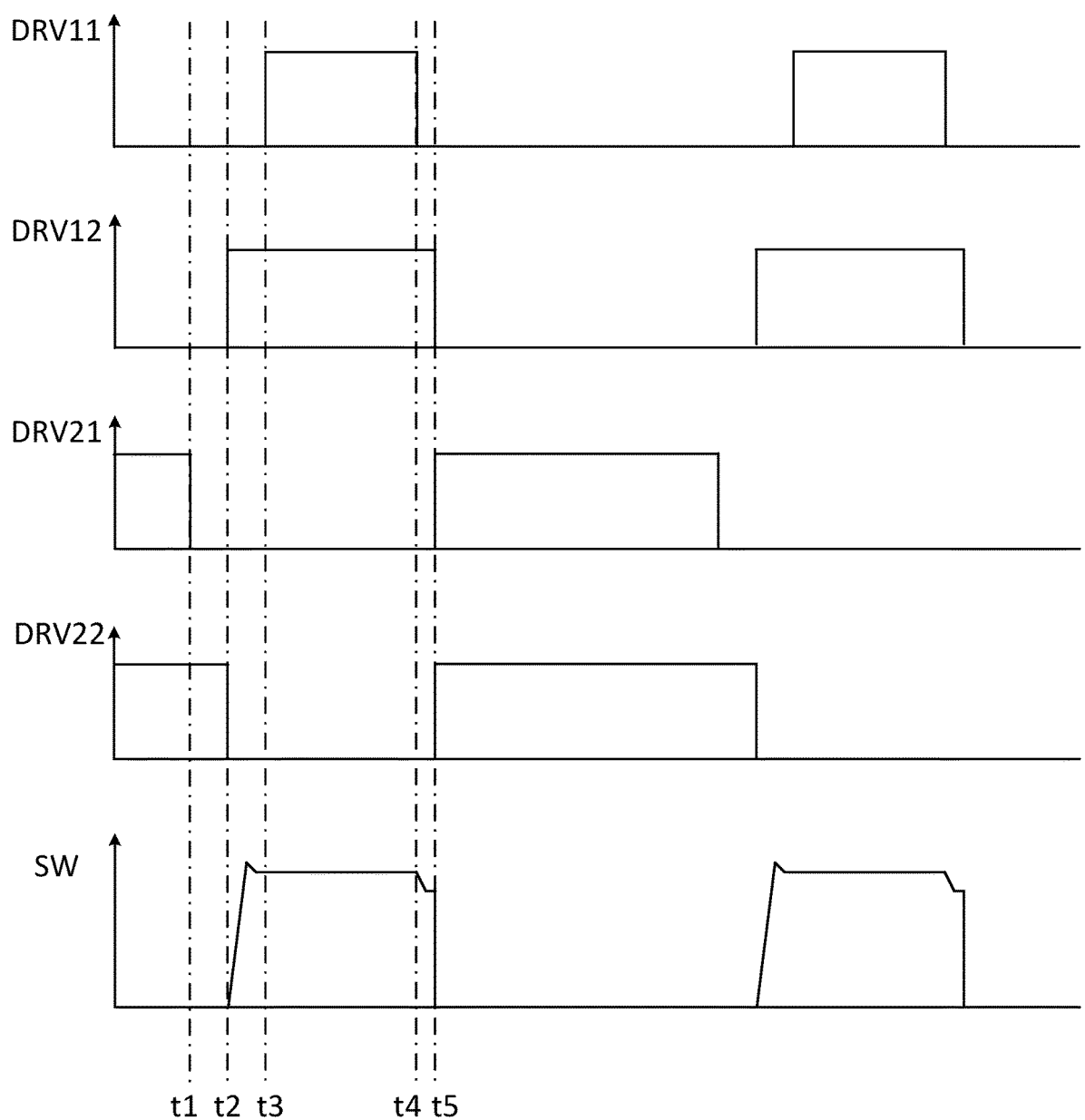
FIG. 8 illustrates a fifth implementation of the gate drive control scheme applied to the step-down converter shown in FIG. 3 in accordance with various embodiments of the present disclosure.

FIG. 8 illustrates a fifth implementation of the gate drive control scheme applied to the step-down converter shown in FIG. 3 in accordance with various embodiments of the present disclosure. There may be five rows in FIG. 8. The first row represents the gate drive signal of the first high-side switching element. The second row represents the gate drive signal of the second high-side switching element. The third row represents the gate drive signal of the first low-side switching element. The fourth row represents the gate drive signal of the second low-side switching element. The fifth row represents the voltage on the switching node.

Prior to t1, both the first low-side switching element Q21 and the second low-side switching element Q22 of the low-side switch are in a turn-on state. In response to a turn-on command of the highs-side switch, the first low-side switching Q21 is turned off at t1. After a first predetermined delay (from t1 to t2), the second low-side switching element Q22 is turned off at t2. At t2, the second high-side switching element Q12 is turned on. In response to the turn-off of the second low-side switching element Q22 and the turn-on of the second high-side switching element Q12, the voltage on the switching node rises from zero to a voltage equal to the input voltage. After a second predetermined delay (from t2 to t3), the first high-side switching element Q11 is turned on at t3.

The high-side switch is fully turned on from t3. From t3 to t4, both the first high-side switching element Q11 and the second high-side switching element Q12 of the low-side switch are in a turn-on state. At t4, in response to a turn-on command of the low-side switch, the first high-side switching element Q11 is turned off. At t5, the second high-side switching element Q12 is turned off. Once the second high-side switching element Q12 has been turned off, the low-side switch is turned on. From t4 to t5, the second high-side switching element Q12 remains on during the turn-on transition of the low-side switch. Such a turn-on transition prevents the body diode of the low-side switch from conducting. As a result, the negative voltage on the switching node caused by the body diode conduction does not occur in FIG. 8.

The turn-on transition of the low-side switch shown FIG. 8 is used in combination with the turn-on transition of the high-side switch shown in FIG. 4. A person skilled in the art would understand this combination is merely an example. Depending on different applications and design needs, the turn-on transition of the low-side switch shown in FIG. 8 can be used in combination with the turn-on transitions of the high-side switch shown in FIGS. 5-6.

Figure 9:
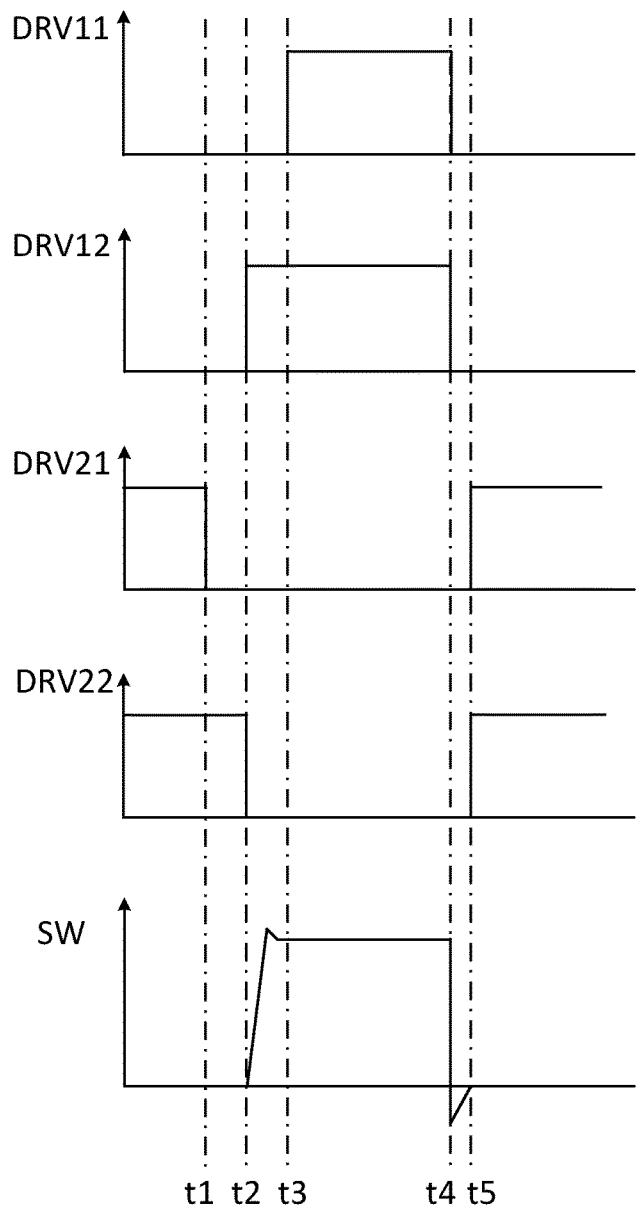
FIG. 9 illustrates an equivalent circuit of the step-down converter shown in FIG. 3 during a turn-on process of the high-side switch in accordance with various embodiments of the present disclosure.
Figure 9:
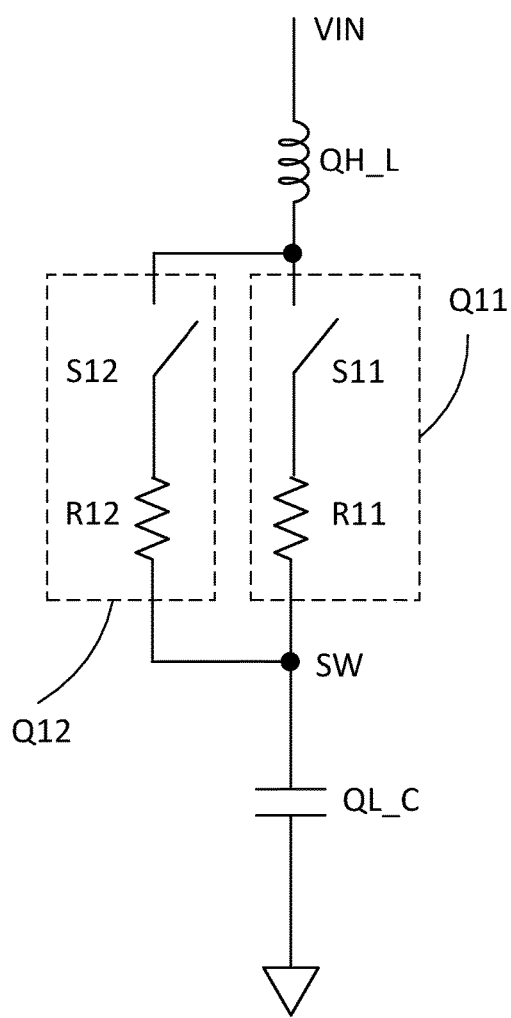

FIG. 9 illustrates an equivalent circuit of the step-down converter shown in FIG. 3 during a turn-on process of the high-side switch in accordance with various embodiments of the present disclosure. The turn-on process of the high-side switch illustrated on the left side of FIG. 9 is similar to that shown in FIG. 4, and hence is not discussed again to avoid unnecessary repetition.

During the turn-on process of the high-side switch, the parasitic inductance of the high-side switch (Q11 and Q12 shown in FIG. 3) is denoted as QH_L as shown in FIG. 9. Q11 is represented by an ideal switch S11 in series with a resistor R11. R11 represents the on resistance of Q11. Q12 is represented by an ideal switch S12 in series with a resistor R12. R12 represents the on resistance of Q12. The parasitic capacitance of the low-side switch (Q21 and Q22 shown in FIG. 3) is denoted as QL_C as shown in FIG. 9. In some embodiments, R11 is much smaller than R12. For example, R11 is 15 milliohms. R12 is 100 milliohms.

During the turn-on process of the high-side switch, the energy in QH_L and QL_C causes an LC oscillation, which generates switching node ringing. In a conventional power converter, Q11 and Q12 are turned on simultaneously. The combined resistance is about 15 milliohms. Such a small resistance cannot effectively damp the LC oscillation caused by QH_L and QL_C. According to the turn-on process of the high-side switch illustrated on the left side of FIG. 9, from t2 to t3, S12 is turned on. R12 is connected in series with QH_L and QL_C. In some embodiments, R12 is a large resistor. Such a large resistor can effectively damp the LC oscillation. As a result, the ringing voltage can be reduced. In addition, the number of ringing cycles is also reduced. In some embodiments, the ringing voltage is attenuated within one ringing cycle as shown in FIG. 9. At t3, S11 is turned on. R11 and R12 are connected in parallel. The high-side switch is fully turned on.

Figure 10:
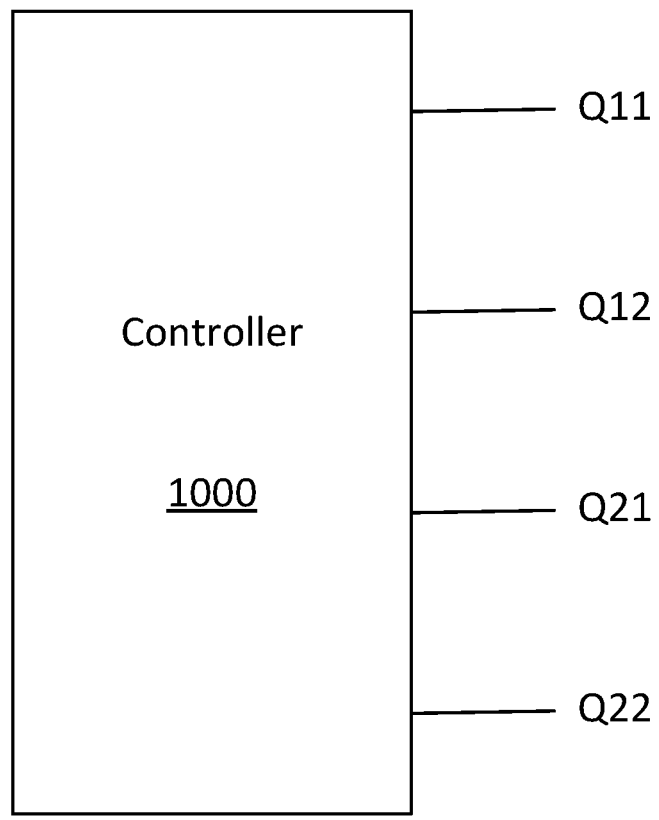
FIG. 10 illustrates a controller for driving the switches of the step-down converter shown in FIG. 3 in accordance with various embodiments of the present disclosure.

FIG. 10 illustrates a controller for driving the switches of the step-down converter shown in FIG. 3 in accordance with various embodiments of the present disclosure. The controller 1000 comprises four gate drivers and a plurality of signal processing devices for processing various operating parameters.

A first gate driver is configured to generate a first gate drive signal applied to the gate of Q11. A second gate driver is configured to generate a second gate drive signal applied to the gate of Q12. A third gate driver is configured to generate a third gate drive signal applied to the gate of Q21. A fourth gate driver is configured to generate a fourth gate drive signal applied to the gate of Q22.

In operation, during a turn-on process of the high-side switch 202, the second low-side switching element Q22 remains on in a first delay counting from a turn-off instant of the first low-side switching element Q21. The first high-side switching element Q11 is turned on after a second delay counting from a turn-on instant of the second high-side switching element Q12. In an embodiment, the second high-side switching element Q12 is turned on once the second low-side switching element Q22 is turned off. In another embodiment, a predetermined dead time is placed between the turn-off of the second low-side switching element Q22 and the turn-on of the second high-side switching element Q12. In yet another embodiment, a predetermined overlap is placed between the turn-on of the second low-side switching element Q22 and the turn-on of the second high-side switching element Q12.

In operation, during a turn-on process of the low-side switch, the second high-side switching element Q12 remains on in a third delay counting from a turn-off instant of the first high-side switching element Q11. Both the first low-side switching element Q21 and the second low-side switching element Q22 are turned on simultaneously. In an embodiment, a predetermined overlap is placed between the turn-on of the low-side switch 204 and the turn-on of the second high-side switching element Q12. In another embodiment, the low-side switch 204 is turned on once the second high-side switching element Q12 is turned off.

It should be noted that the controller 1000 having four gate drivers described above is merely an example, which should not unduly limit the scope of the claims. One of ordinary skill in the art would recognize many variations, alternatives, and modifications. For example, external gate drivers may be used to further improve the drive capability.

Figure 11:
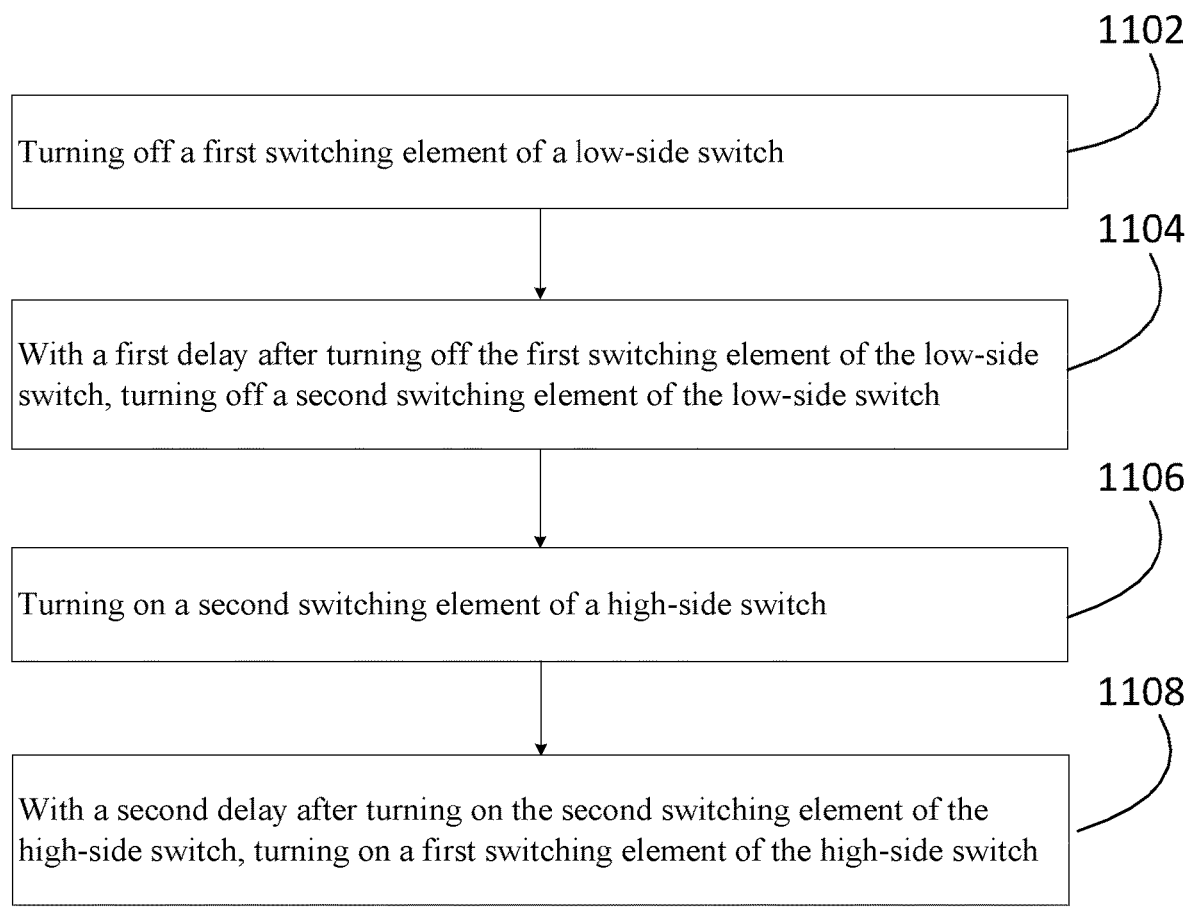
FIG. 11 illustrates a flow chart of controlling the step-down converter shown in FIG. 3 in accordance with various embodiments of the present disclosure.

FIG. 11 illustrates a flow chart of controlling the step-down converter shown in FIG. 3 in accordance with various embodiments of the present disclosure. This flowchart shown in FIG. 11 is merely an example, which should not unduly limit the scope of the claims. One of ordinary skill in the art would recognize many variations, alternatives, and modifications. For example, various steps illustrated in FIG. 11 may be added, removed, replaced, rearranged and repeated.

Referring back to FIG. 3, the step-down converter comprises a high-side switch 202 and a low-side switch 204 connected in series between the input voltage bus VIN and ground. The high-side switch 202 comprises a first high-side switching element Q11 and a second high-side switching element Q12 connected in parallel between VIN and the switching node SW. The first high-side switching element Q11 comprises a first number of high-side transistor cells connected in parallel. The second high-side switching element Q12 comprises a second number of high-side transistor cells connected in parallel. The low-side switch 204 comprises a first low-side switching element Q21 and a second low-side switching element Q22 connected in parallel between the switching node SW and ground. The first low-side switching element Q21 comprises a first number of low-side transistor cells connected in parallel. The second high-side switching element Q22 comprises a second number of low-side transistor cells connected in parallel.

At step 1102, a first switching element of a low-side switch is turned off.

At step 1104, with a first delay after turning off the first switching element of the low-side switch, a second switching element of the low-side switch is turned off.

At step 1106, a second switching element of a high-side switch is turned on.

At step 1108, with a second delay after turning on the second switching element of the high-side switch, a first switching element of the high-side switch is turned on.

Referring back to FIG. 4, the method further comprises during a turn-on process of the high-side switch, turning on the second switching element of the high-side switch once the second switching element of the low-side switch is turned off.

Referring back to FIG. 5, the method further comprises during a turn-on process of the high-side switch, placing a first predetermined dead time between turning off the second switching element of the low-side switch and turning on the second switching element of the high-side switch.

Referring back to FIG. 6, in a first predetermined overlap (e.g., from t12 to t2), both the second switching element of the low-side switch and the second switching element of the high-side switch are in an on state during a turn-on process of the high-side switch.

Referring back to FIG. 4, the method further comprises during a turn-on process of the low-side switch, turning off the first switching element of the high-side switch and the second switching element of the high-side switch simultaneously, and after a second predetermined dead time, turning on the first switching element of the low-side switch and the second switching element of the low-side switch simultaneously.

Referring back to FIGS. 7-8, the method further comprises during a turn-on process of the low-side switch, turning off the first switching element of the high-side switch, with a third delay after turning off the first switching element of the high-side switch, turning off the second switching element of the high-side switch, and turning on the first switching element of the low-side switch and the second switching element of the low-side switch simultaneously.

Referring back to FIG. 7, in a second predetermined overlap (e.g., from t5 to t6), both the low-side switch and the second switching element of the high-side switch are in an on state during the turn-on process of the low-side switch.

Referring back to FIG. 8, the method further comprises during the turn-on process of the low-side switch, turning on the low-side switch once the second switching element of the high-side switch is turned off.

Referring back to FIG. 3, the high-side switch, the low-side switch and an inductor form a step-down converter. The high-side switch and the low-side switch are connected in series between an input voltage bus and ground. The inductor is connected between a common node of the high-side switch and the low-side switch, and an output bus of the step-down converter.

Figure 12:
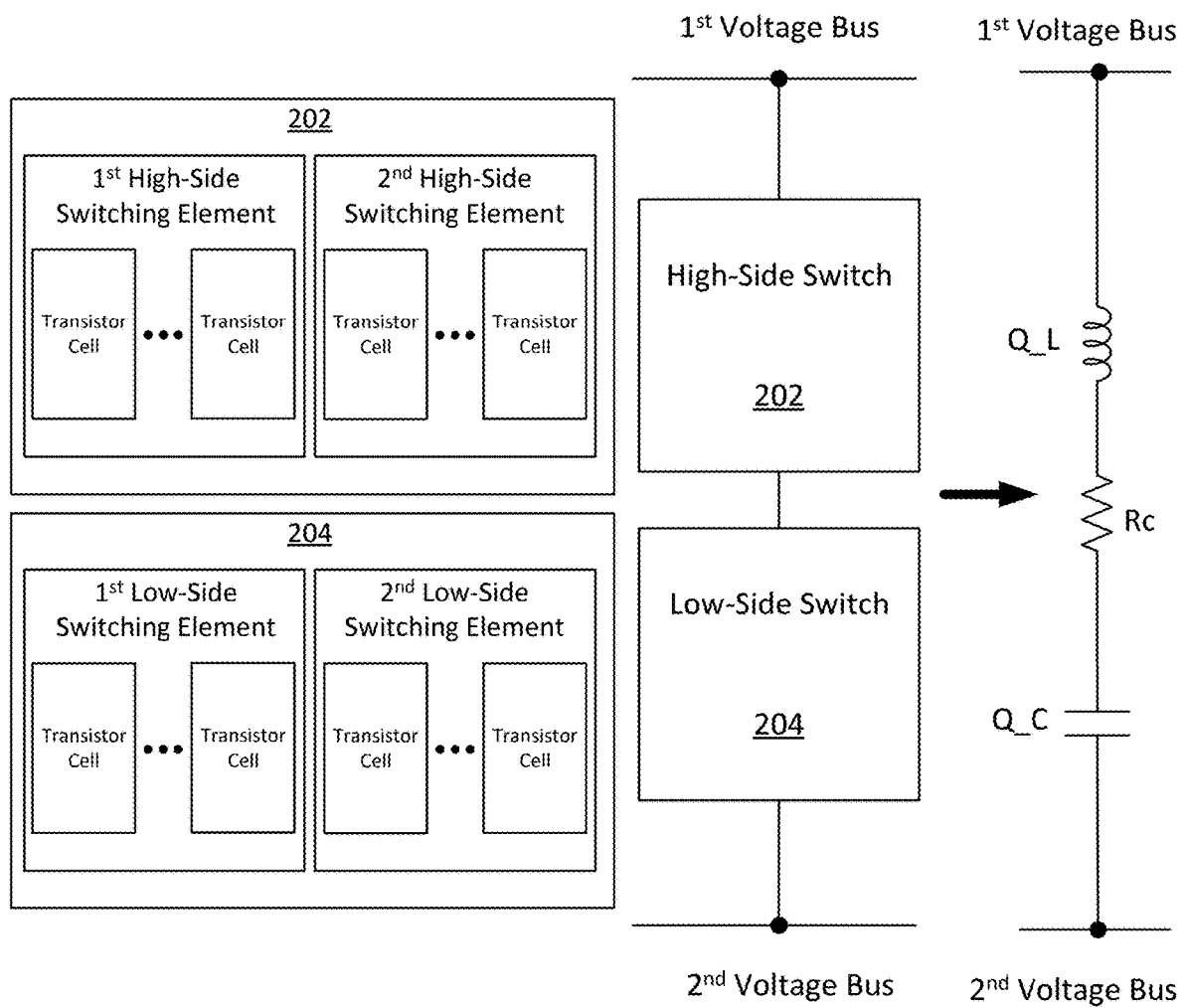
FIG. 12 illustrates a block diagram of a system comprising a high-side switch and a low-side switch connected in series in accordance with various embodiments of the present disclosure.

FIG. 12 illustrates a block diagram of a system comprising a high-side switch and a low-side switch connected in series in accordance with various embodiments of the present disclosure. As shown in the left side of FIG. 12, a high-side switch 202 and a low-side switch 204 are connected in series between a first voltage bus and a second voltage bus. In some embodiments, the high-side switch 202 and a low-side switch 204 may be part of a step-down power converter. In alternative embodiments, the high-side switch 202 and a low-side switch 204 may be part of other suitable power conversion systems such as a full-bridge power converter, a half-bridge power converter, a motor driver and the like. Furthermore, the high-side switch 202 and a low-side switch 204 may be part of suitable signal processing circuits.

In some embodiments, the highs-side switch 202 is formed by the hybrid power transistor apparatus shown in FIG. 1. In particular, the high-side switch 202 comprises a first high-side switching element comprising a first number of high-side transistor cells connected in parallel, and a second high-side switching element comprising a second number of high-side transistor cells connected in parallel. Throughout the description, the first high-side switching element is alternatively referred to as the first switching element of the high-side switch. The second high-side switching element is alternatively referred to as the second switching element of the high-side switch.

The low-side switch 204 is formed by the hybrid power transistor apparatus shown in FIG. 1. In particular, the low-side switch 204 comprises a first low-side switching element comprising a first number of low-side transistor cells connected in parallel, and a second low-side switching element comprising a second number of low-side transistor cells connected in parallel. Throughout the description, the first low-side switching element is alternatively referred to as the third switching element of the low-side switch. The second low-side switching element is alternatively referred to as the fourth switching element of the low-side switch.

During the turn-on process of a power switch (e.g., the high-side switch 202), the parasitic inductance Q_L (e.g., the parasitic inductance of the high-side switch 202) and the parasitic capacitance Q_C (e.g., the parasitic capacitance the low-side switch 204) cause an LC oscillation, which generates switching node ringing.

In operation, during a transition from turning off the one switch of the high-side switch and the low-side switch to turning on the other switch of the high-side switch and the low-side switch, at least one switch of the high-side switch and the low-side switch is configured to function as a controllable large resistor Rc. As shown in the right side of FIG. 12, the controllable large resistor Rc is connected in series with Q_L and Q_C. In some embodiments, Rc is a large resistor configured to absorb the energy from Q_L and Q_C. As a result, Rc can effectively damp the LC oscillation, thereby reducing the ringing voltage.

One advantageous feature of having Rc as shown in FIG. 12 is the input ceramic capacitors (e.g., 10 microfarads or 1 microfarad ceramic capacitors placed at an input of a power converter) can be removed once the ringing voltage is reduced. The removal of the input ceramic capacitors helps to reduce the cost of the power converter.

In operation, a high-side turn-on control scheme is applied to the high-side switch 202 and the low-side switch 204 to reduce the ringing on the switching node. The detailed operating principles of the high-side turn-on control scheme will be described below with respect to FIGS. 13-18. Likewise, a low-side turn-on control scheme is applied to the high-side switch 202 and the low-side switch 204 to reduce the ground ringing. The detailed operating principles of the low-side turn-on control scheme will be described below with respect to FIGS. 19-24.

Figure 13:
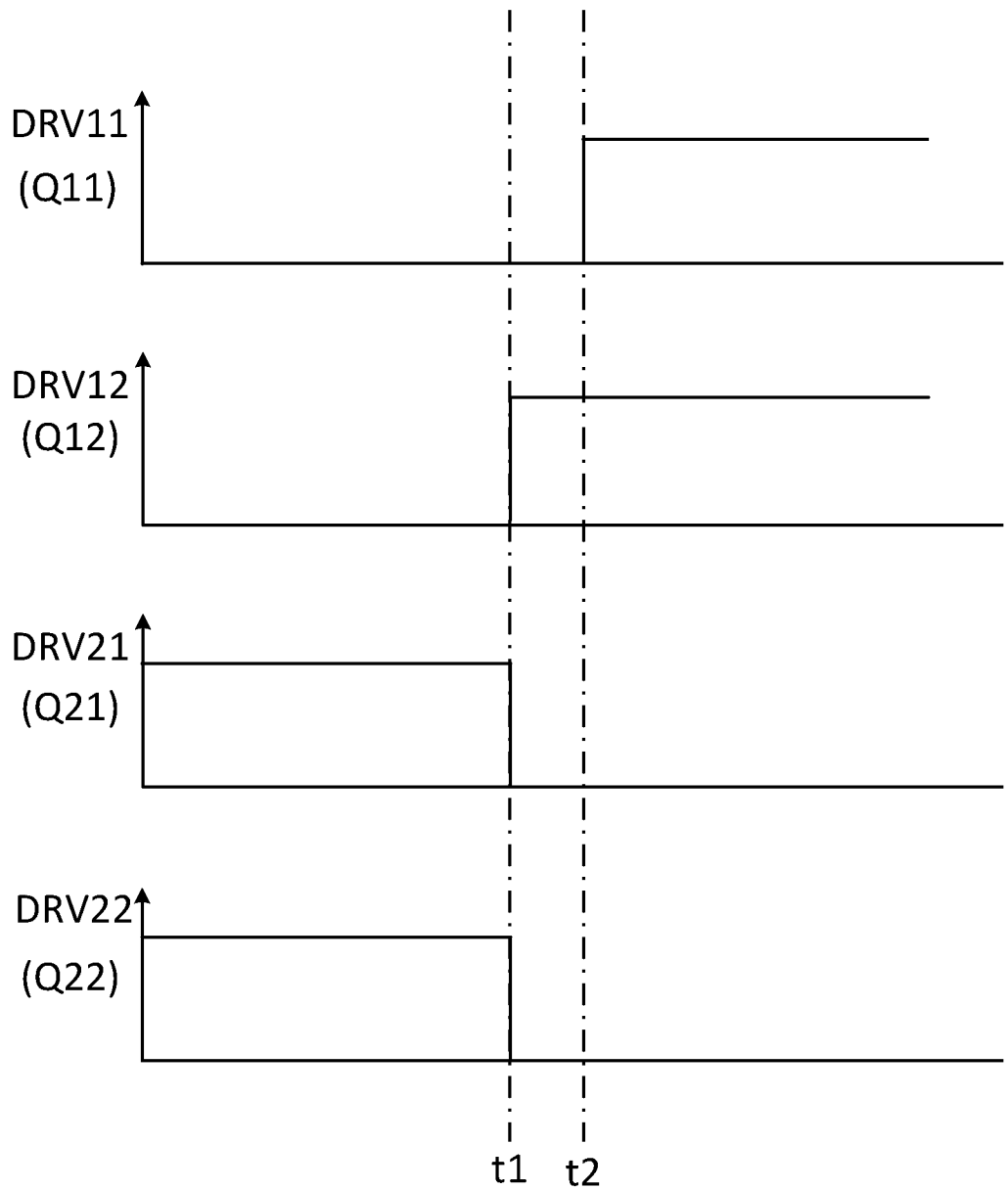
FIG. 13 illustrates a first implementation of the high-side turn-on control scheme applied to the step-down converter shown in FIG. 3 in accordance with various embodiments of the present disclosure.

FIG. 13 illustrates a first implementation of the high-side turn-on control scheme applied to the step-down converter shown in FIG. 3 in accordance with various embodiments of the present disclosure. The horizontal axis of FIG. 13 represents intervals of time. There may be four rows in FIG. 13. The first row represents the gate drive signal of the first high-side switching element Q11. The second row represents the gate drive signal of the second high-side switching element Q12. The third row represents the gate drive signal of the first low-side switching element Q21. The fourth row represents the gate drive signal of the second low-side switching element Q22. Referring back to FIG. 3, splitting the high-side switch into Q11 and Q12, and splitting the low-side switch into Q21 and Q22 are merely an example, which should not unduly limit the scope of the claims. One of ordinary skill in the art would recognize many variations, alternatives, and modification. The splitting arrangement may have many variations as long as a portion of a power switch (e.g., Q12 and/or Q22) can be used as a controllable large resistor.

Referring back to FIG. 3, the high-side switch 202 comprises a first high-side switching element Q11 comprising a first number of high-side transistor cells connected in parallel, and a second high-side switching element Q12 comprising a second number of high-side transistor cells connected in parallel. The low-side switch 204 comprises a first low-side switching element Q21 comprising a first number of low-side transistor cells connected in parallel, and a second low-side switching element Q22 comprising a second number of low-side transistor cells connected in parallel.

As shown in FIG. 13, prior to t1, both the first low-side switching element Q21 and the second low-side switching element Q22 of the low-side switch are in a turn-on state. In response to a turn-on command of the high-side switch, both the first low-side switching element Q21 and the second low-side switching element Q22 of the low-side switch are turned off at t1. Also at t1, the second high-side switching element Q12 is turned on. After a predetermined delay (from t1 to t2), the first high-side switching element Q11 is turned on at t2.

In some embodiments, the predetermined delay is in a range from about 10 nanoseconds to about 50 nanoseconds. The predetermined delay (e.g., 10 nanoseconds) is merely an example, which should not unduly limit the scope of the claims. One of ordinary skill in the art would recognize many variations, alternatives, and modifications. For example, the switching frequency of a power converter may vary under different applications and design needs. Accordingly, the predetermined delay may vary in response to the change of the switching frequency or the change of the rise and falling time of the power switches.

Referring back to FIG. 9, during the turn-on process of the high-side switch, the energy in QH_L and QL_C causes an LC oscillation, which generates switching node ringing. In a conventional power converter, Q11 and Q12 are turned on simultaneously. The combined resistance is about 15 milliohms. Such a small resistance cannot effectively damp the LC oscillation caused by QH_L and QL_C. According to the turn-on process of the high-side switch illustrated in FIG. 13, from t1 to t2, the second high-side switching element Q12 is turned on. The turn-on of the second high-side switching element Q12 is equivalent to adding a controllable large resistor connected in series with QH_L and QL_C. Such a controllable large resistor can effectively damp the LC oscillation. As a result, the ringing voltage can be reduced.

One advantageous feature of the high-side turn-on control scheme shown in FIG. 13 is that the switching node ringing can be significantly reduced. From t1 to t2, the second high-side switching element Q12 functions as a large resistor (e.g., 1 ohm for p-type MOSFETs). Such a large resistor functions as a damping resistor configured to effectively attenuate the oscillation caused by the parasitic inductances and capacitances of the switches, thereby reducing the ringing on the switching node.

Another advantageous feature of the high-side turn-on control scheme shown in FIG. 13 is that the turn-on of the second high-side switching element Q12 from t1 to t2 helps to prevent the body diode of the low-side switch from conducting, thereby improving the efficiency of the step-down converter.

Figure 14:
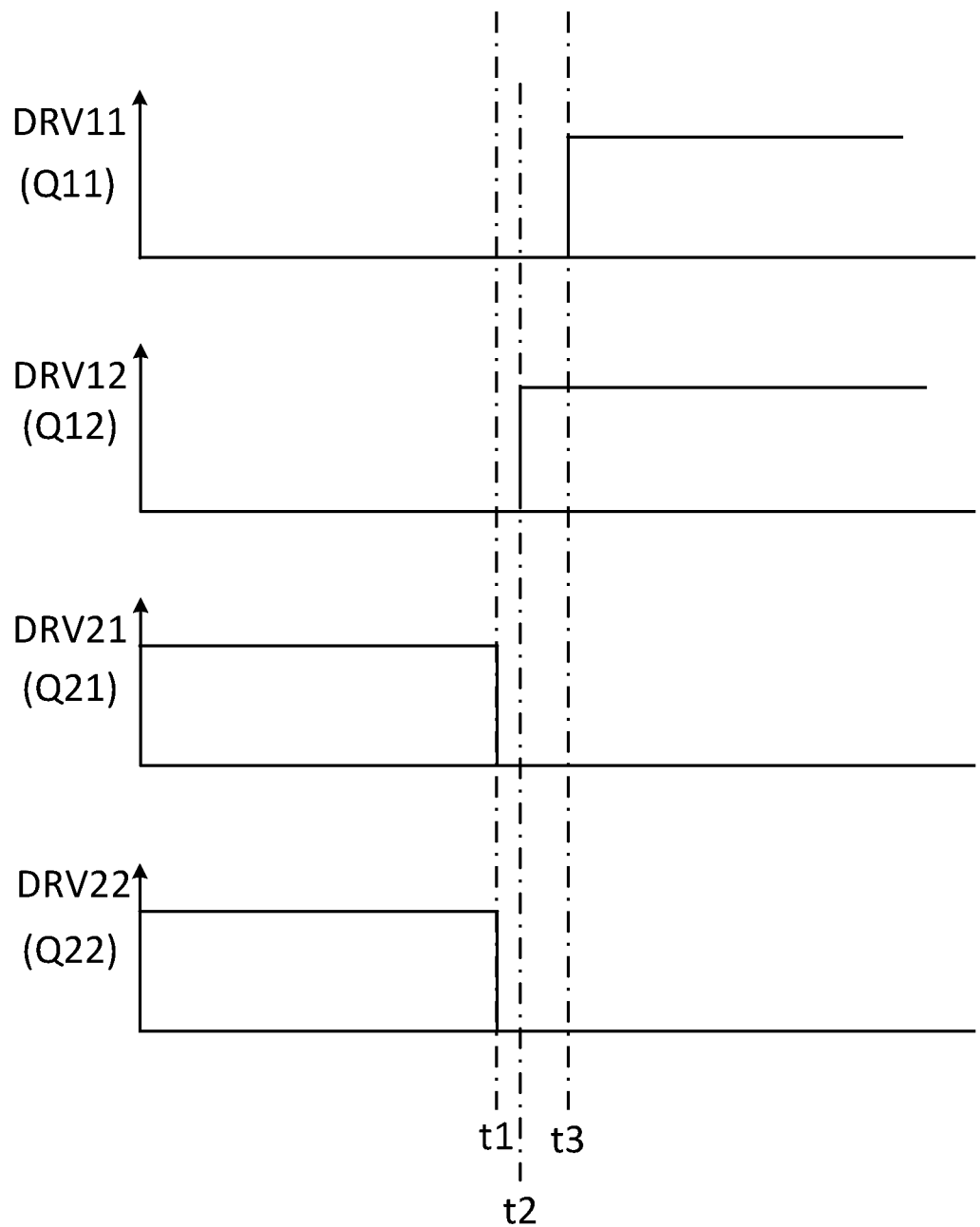
FIG. 14 illustrates a second implementation of the high-side turn-on control scheme applied to the step-down converter shown in FIG. 3 in accordance with various embodiments of the present disclosure.

FIG. 14 illustrates a second implementation of the high-side turn-on control scheme applied to the step-down converter shown in FIG. 3 in accordance with various embodiments of the present disclosure. The second implementation of the high-side turn-on control scheme shown in FIG. 14 is similar to that shown in FIG. 13 except that a predetermined dead time (from t1 to t2) is added.

In some embodiments, the predetermined dead time is in a range from about 5 nanoseconds to about 10 nanoseconds. The predetermined delay (e.g., 5 nanoseconds) is merely an example, which should not unduly limit the scope of the claims. One of ordinary skill in the art would recognize many variations, alternatives, and modifications.

As shown in FIG. 14, at t1, both the first low-side switching element Q21 and the second low-side switching element Q22 of the low-side switch are turned off. A predetermined dead time (from t1 to t2) is placed between turning off the low-side switch and turning on the second high-side switching element Q12. As shown in FIG. 14, the second high-side switching element Q12 is turned on at t2. After a predetermined delay counting from t2, the first high-side switching element Q11 is turned on at t3. During the predetermined delay (from t2 to t3), the second high-side switching element Q12 functions as a controllable large resistor for reducing ringing.

Figure 15:
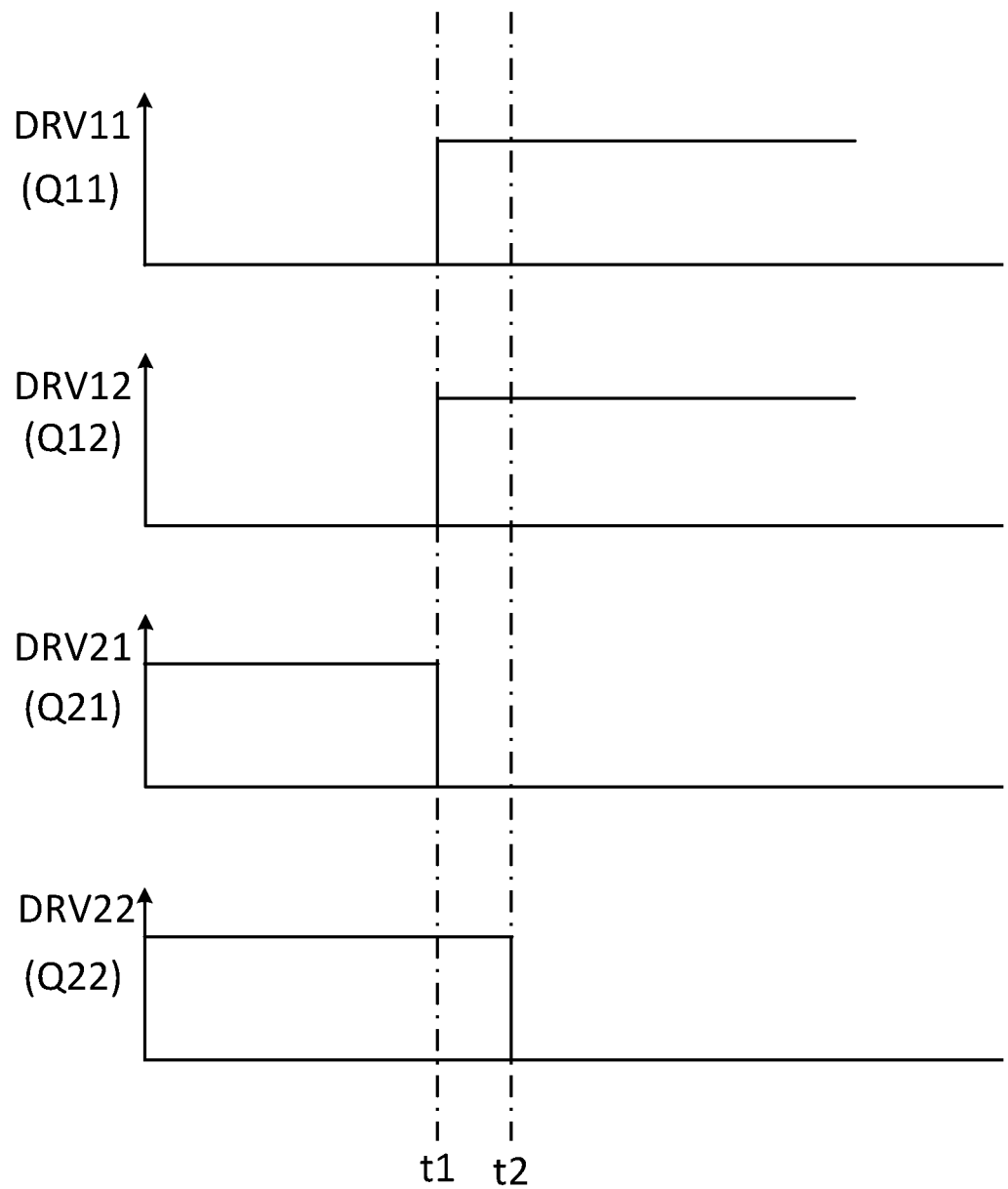
FIG. 15 illustrates a third implementation of the high-side turn-on control scheme applied to the step-down converter shown in FIG. 3 in accordance with various embodiments of the present disclosure.

FIG. 15 illustrates a third implementation of the high-side turn-on control scheme applied to the step-down converter shown in FIG. 3 in accordance with various embodiments of the present disclosure. The third implementation of the high-side turn-on control scheme shown in FIG. 15 is similar to that shown in FIG. 13 except that the second low-side switching element Q22 functions as a large resistor during the turn-on transition of the high-side switch.

As shown in FIG. 15, at t1, the first low-side switching element Q21 is turned off. The high-side switch is turned on at t1. After a predetermined delay counting from t1, the second low-side switching element Q22 is turned off at t2. During the predetermined delay (from t1 to t2), the second low-side switching element Q22 functions as a controllable large resistor for reducing ringing.

Figure 16:
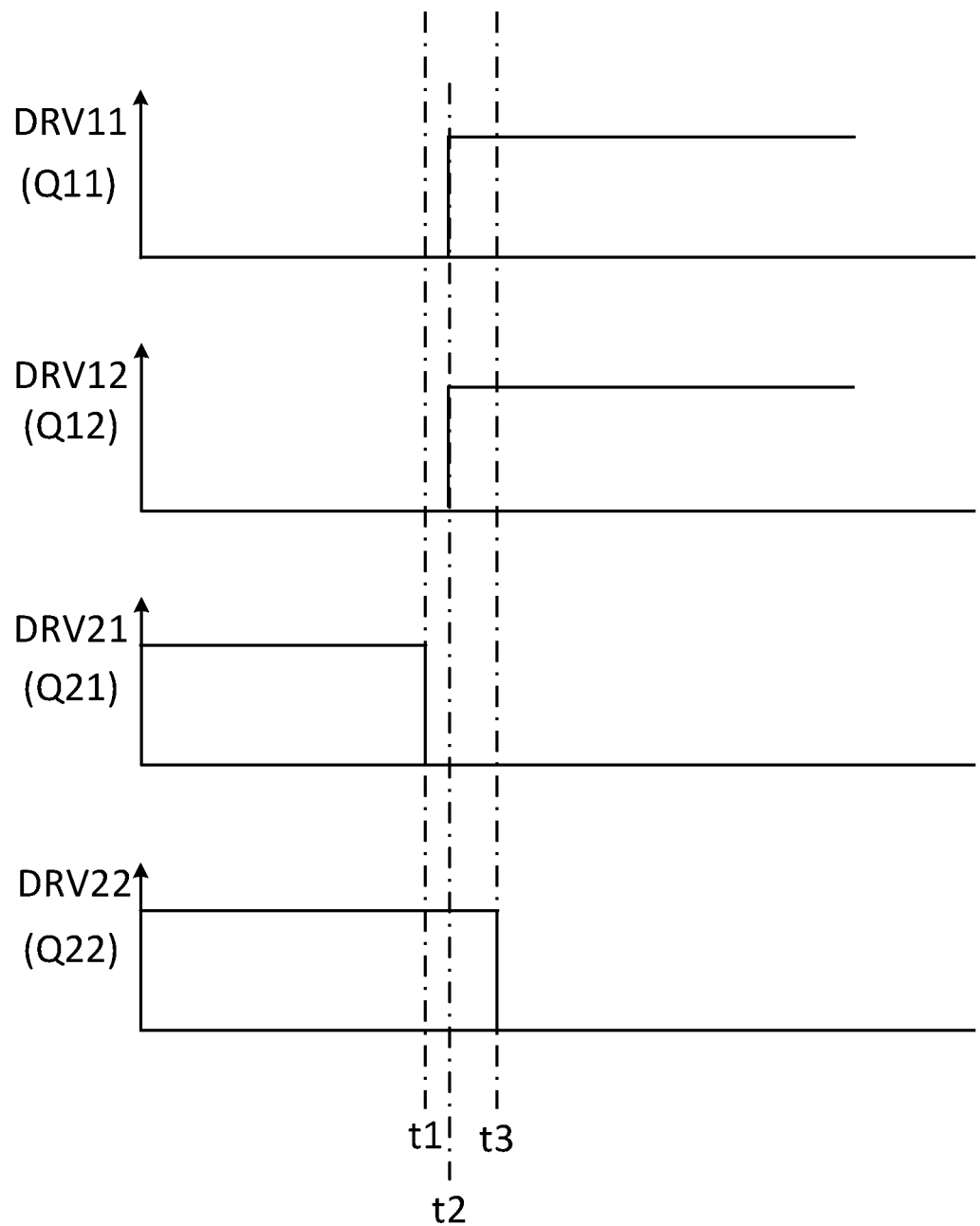
FIG. 16 illustrates a fourth implementation of the high-side turn-on control scheme applied to the step-down converter shown in FIG. 3 in accordance with various embodiments of the present disclosure.

FIG. 16 illustrates a fourth implementation of the high-side turn-on control scheme applied to the step-down converter shown in FIG. 3 in accordance with various embodiments of the present disclosure. The fourth implementation of the high-side turn-on control scheme shown in FIG. 16 is similar to that shown in FIG. 15 except that a predetermined dead time (from t1 to t2) is added.

As shown in FIG. 16, at t1, the first low-side switching element Q21 is turned off. A predetermined dead time (from t1 to t2) is placed between turning off the first low-side switching element Q21 and turning on the high-side switch. As shown in FIG. 16, the high-side switch (Q11 and Q12) is turned on at t2. After a predetermined delay counting from t2, the second low-side switching element Q22 is turned off at t3. During the predetermined delay (from t2 to t3), the second low-side switching element Q22 functions as a controllable large resistor for reducing ringing.

Figure 17:
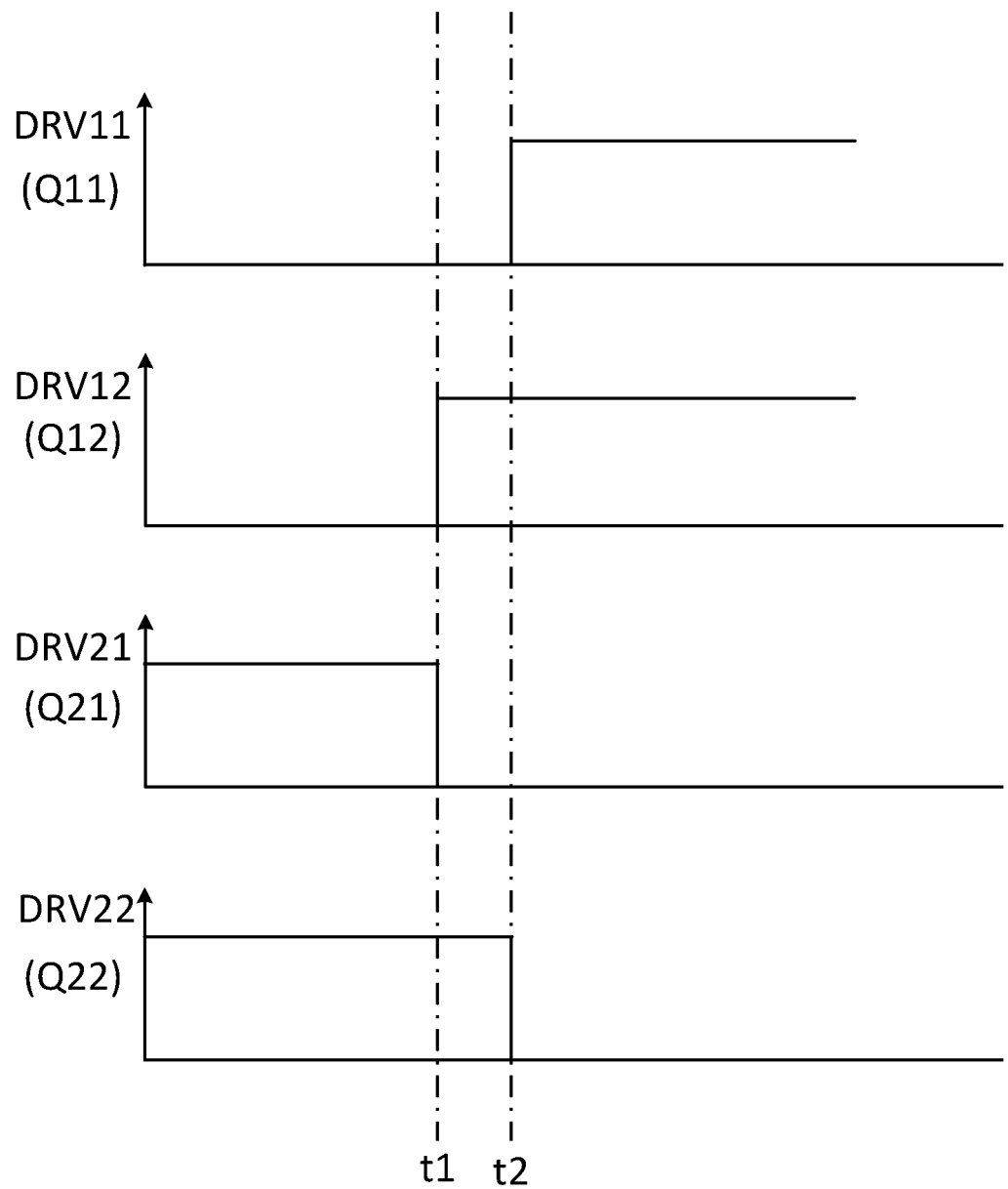
FIG. 17 illustrates a fifth implementation of the high-side turn-on control scheme applied to the step-down converter shown in FIG. 3 in accordance with various embodiments of the present disclosure.

FIG. 17 illustrates a fifth implementation of the high-side turn-on control scheme applied to the step-down converter shown in FIG. 3 in accordance with various embodiments of the present disclosure. The fifth implementation of the high-side turn-on control scheme shown in FIG. 17 is similar to that shown in FIG. 13 except that during the turn-on transition of the high-side switch, the second high-side switching element Q12 and the second low-side switching element Q22 are connected in series to form a large resistor.

As shown in FIG. 17, at t1, the first low-side switching element Q21 is turned off. The second high-side switching element Q12 is turned on at t1. After a predetermined delay counting from t1, the first high-side switching element Q11 is turned on at t2, and the second low-side switching element Q22 is turned off at t2. During the predetermined delay (from t1 to t2), the second high-side switching element Q12 and the second low-side switching element Q22 are connected in series to form a controllable large resistor for reducing ringing.

It should be noted that the alignment between the turn-on time of Q11 and the turn-off time of Q22 is merely an example. Depending on different applications or design needs, the turn-off time of Q22 may be before or after the turn-on time of Q11.

Figure 18:
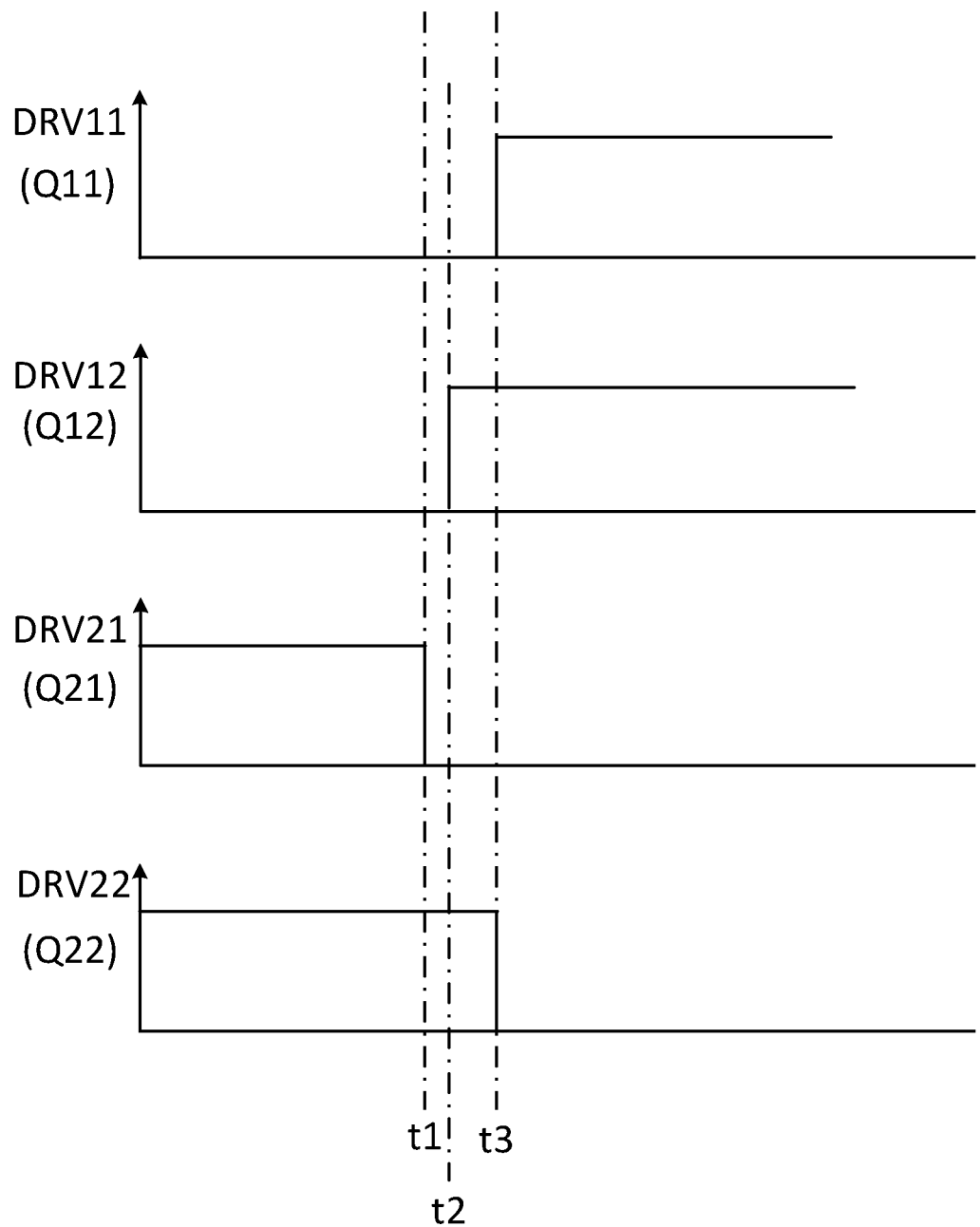
FIG. 18 illustrates a sixth implementation of the high-side turn-on control scheme applied to the step-down converter shown in FIG. 3 in accordance with various embodiments of the present disclosure.

FIG. 18 illustrates a sixth implementation of the high-side turn-on control scheme applied to the step-down converter shown in FIG. 3 in accordance with various embodiments of the present disclosure. The sixth implementation of the high-side turn-on control scheme shown in FIG. 18 is similar to that shown in FIG. 17 except that a predetermined dead time (from t1 to t2) is added.

As shown in FIG. 18, at t1, the first low-side switching element Q21 is turned off. A predetermined dead time (from t1 to t2) is placed between turning off the first low-side switching element Q21 and turning on the second high-side switching element Q12. As shown in FIG. 18, the second high-side switching element Q12 is turned on at t2. After a predetermined delay counting from t2, the first high-side switching element Q11 is turned on at t3, and the second low-side switching element Q22 is turned off at t3. During the predetermined delay (from t2 to t3), the second high-side switching element Q12 and the second low-side switching element Q22 are connected in series to form a controllable large resistor for reducing ringing.

It should be noted that the alignment between the turn-on time of Q11 and the turn-off time of Q22 is merely an example. Depending on different applications or design needs, the turn-off time of Q22 may be before or after the turn-on time of Q11.

Figure 19:
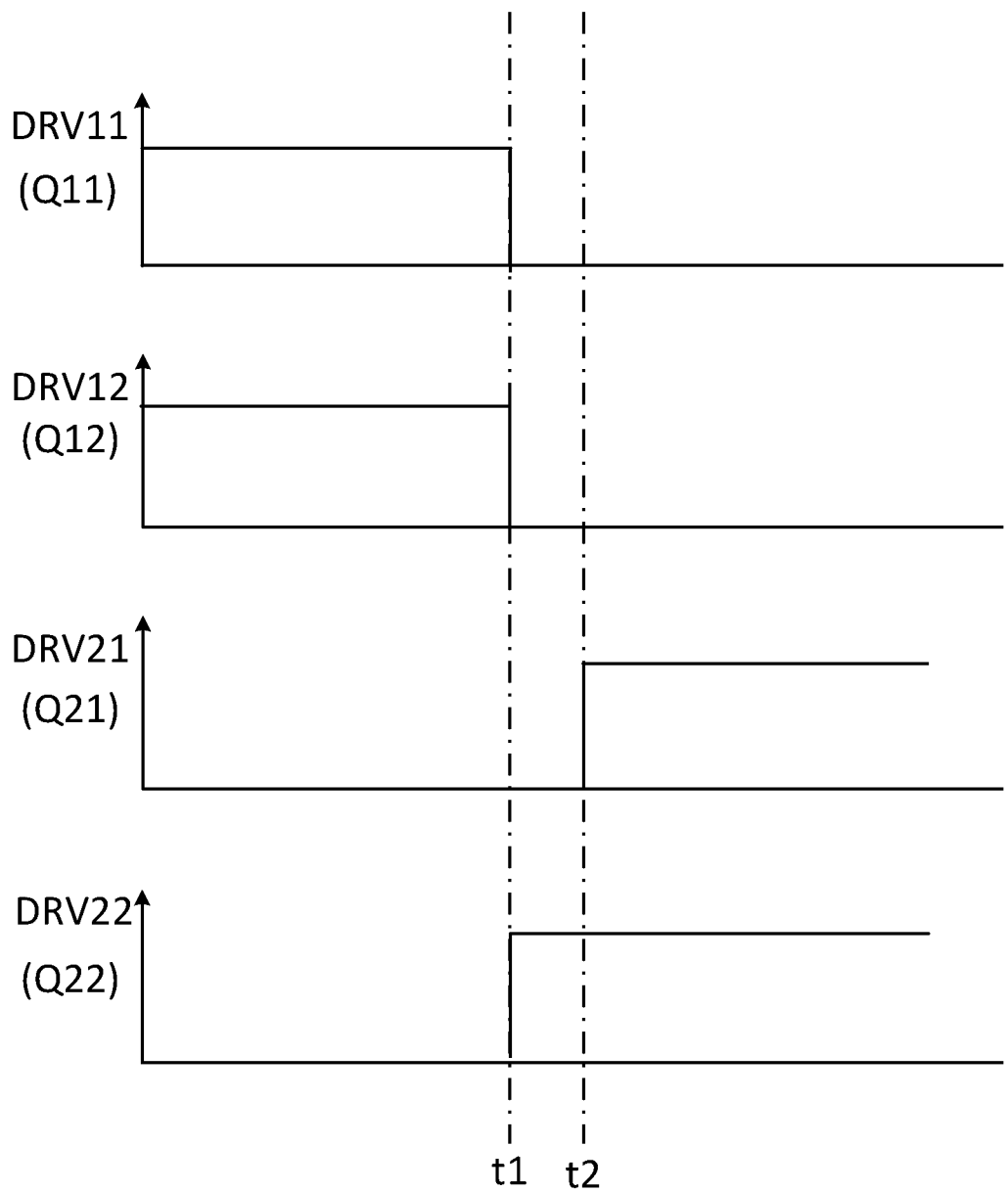
FIG. 19 illustrates a first implementation of the low-side turn-on control scheme applied to the step-down converter shown in FIG. 3 in accordance with various embodiments of the present disclosure.

FIG. 19 illustrates a first implementation of the low-side turn-on control scheme applied to the step-down converter shown in FIG. 3 in accordance with various embodiments of the present disclosure. The horizontal axis of FIG. 19 represents intervals of time. There may be four rows in FIG. 19. The first row represents the gate drive signal of the first high-side switching element Q11. The second row represents the gate drive signal of the second high-side switching element Q12. The third row represents the gate drive signal of the first low-side switching element Q21. The fourth row represents the gate drive signal of the second low-side switching element Q22.

Referring back to FIG. 3, the high-side switch 202 comprises a first high-side switching element Q11 comprising a first number of high-side transistor cells connected in parallel, and a second high-side switching element Q12 comprising a second number of high-side transistor cells connected in parallel. The low-side switch 204 comprises a first low-side switching element Q21 comprising a first number of low-side transistor cells connected in parallel, and a second low-side switching element Q22 comprising a second number of low-side transistor cells connected in parallel.

As shown in FIG. 19, prior to t1, both the first high-side switching element Q11 and the second high-side switching element Q12 of the high-side switch are in a turn-on state. In response to a turn-on command of the low-side switch, both the first high-side switching element Q11 and the second high-side switching element Q12 of the high-side switch are turned off at t1. Also at t1, the second low-side switching element Q22 is turned on. After a predetermined delay (from t1 to t2), the first low-side switching element Q21 is turned on at t2.

During the turn-on process of the low-side switch, the energy in parasitic inductor and capacitor causes an LC oscillation, which generates ground ringing. In a conventional power converter, Q21 and Q22 are turned on simultaneously. The combined resistance is about 15 milliohms. Such a small resistance cannot effectively damp the LC oscillation. According to the turn-on process of the low-side switch illustrated in FIG. 19, from t1 to t2, the second low-side switching element Q22 is turned on. The turn-on of the second low-side switching element Q22 is equivalent to adding a controllable large resistor connected in series with the parasitic inductor and capacitor. Such a controllable large resistor can effectively damp the LC oscillation. As a result, the ringing voltage can be reduced.

Figure 20:
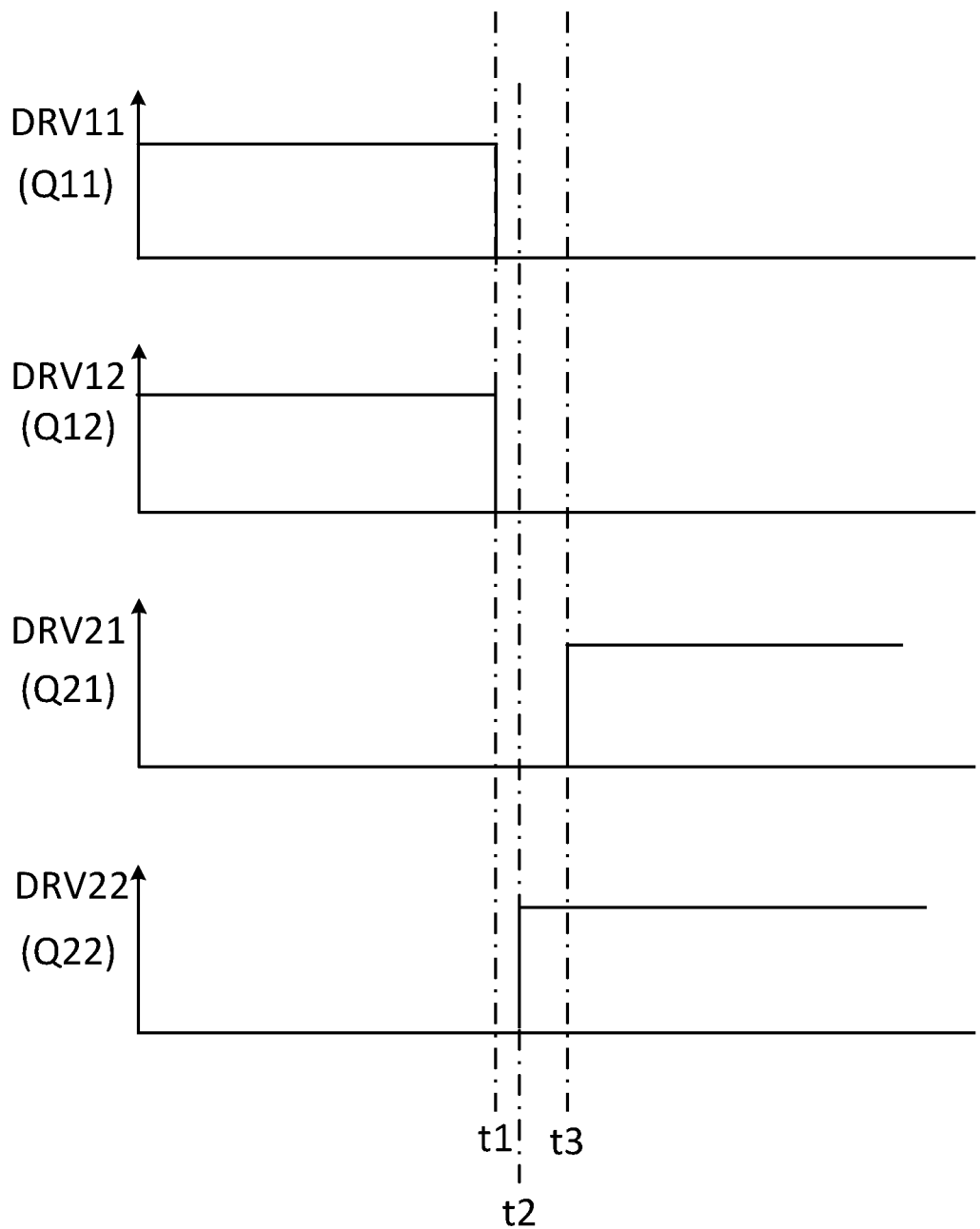
FIG. 20 illustrates a second implementation of the low-side turn-on control scheme applied to the step-down converter shown in FIG. 3 in accordance with various embodiments of the present disclosure.

FIG. 20 illustrates a second implementation of the low-side turn-on control scheme applied to the step-down converter shown in FIG. 3 in accordance with various embodiments of the present disclosure. The second implementation of the low-side turn-on control scheme shown in FIG. 20 is similar to that shown in FIG. 19 except that a predetermined dead time (from t1 to t2) is added.

As shown in FIG. 20, at t1, both the first high-side switching Q11 and the second high-side switching element Q12 of the high-side switch are turned off. A predetermined dead time (from t1 to t2) is placed between turning off the high-side switch (Q11 and Q12) and turning on the second low-side switching element Q22. As shown in FIG. 20, the second low-side switching element Q22 is turned on at t2. After a predetermined delay counting from t2, the first low-side switching element Q21 is turned on at t3. During the predetermined delay (from t2 to t3), the second low-side switching element Q22 functions as a controllable large resistor for reducing ringing.

Figure 21:
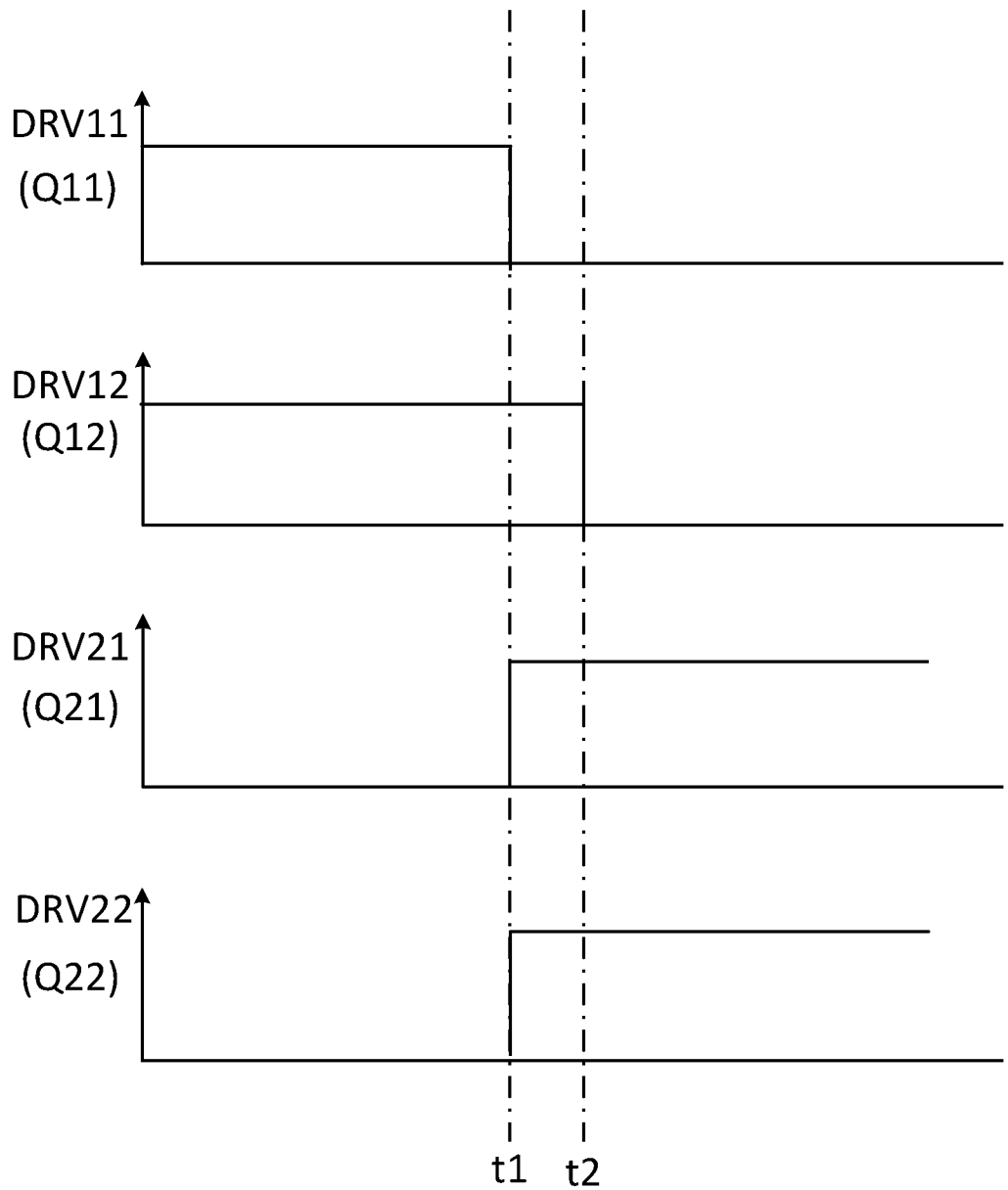
FIG. 21 illustrates a third implementation of the low-side turn-on control scheme applied to the step-down converter shown in FIG. 3 in accordance with various embodiments of the present disclosure.

FIG. 21 illustrates a third implementation of the low-side turn-on control scheme applied to the step-down converter shown in FIG. 3 in accordance with various embodiments of the present disclosure. The third implementation of the low-side turn-on control scheme shown in FIG. 21 is similar to that shown in FIG. 19 except that the second high-side switching element Q12 functions as a large resistor during the turn-on transition of the low-side switch.

As shown in FIG. 21, at t1, the first high-side switching element Q11 is turned off. The low-side switch is turned on at t1. After a predetermined delay counting from t1, the second high-side switching element Q12 is turned off at t2. During the predetermined delay (from t1 to t2), the second high-side switching element Q12 functions as a controllable large resistor for reducing ringing.

Figure 22:
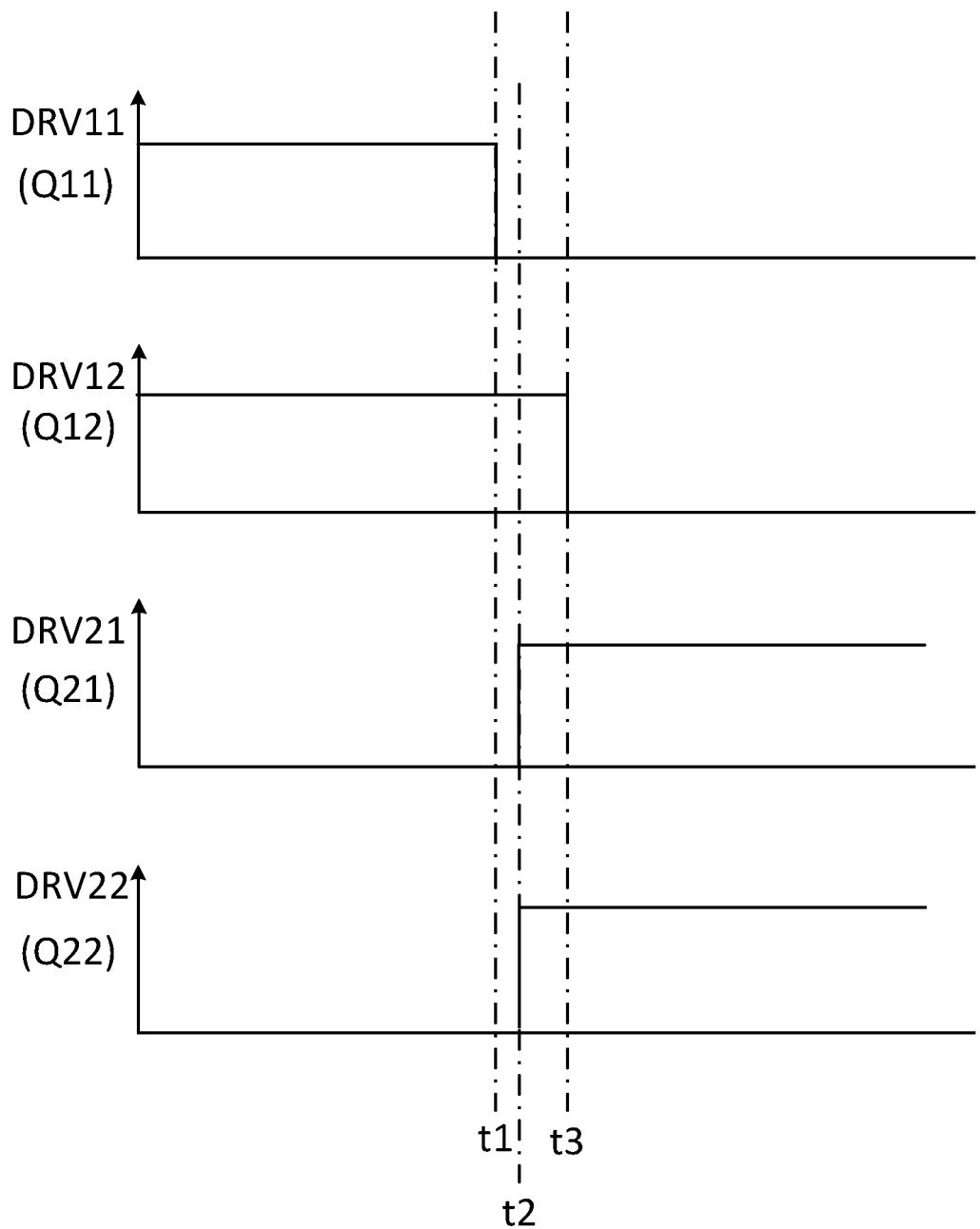
FIG. 22 illustrates a fourth implementation of the low-side turn-on control scheme applied to the step-down converter shown in FIG. 3 in accordance with various embodiments of the present disclosure.

FIG. 22 illustrates a fourth implementation of the low-side turn-on control scheme applied to the step-down converter shown in FIG. 3 in accordance with various embodiments of the present disclosure. The fourth implementation of the low-side urn-on control scheme shown in FIG. 22 is similar to that shown in FIG. 21 except that a predetermined dead time (from t1 to t2) is added.

As shown in FIG. 22, at t1, the first high-side switching element Q11 is turned off. A predetermined dead time (from t1 to t2) is placed between turning off the first high-side switching element Q11 and turning on the low-side switch (Q21 and Q22). As shown in FIG. 22, the low-side switch is turned on at t2. After a predetermined delay counting from t2, the second high-side switching element Q12 is turned off at t3. During the predetermined delay (from t2 to t3), the second high-side switching element Q12 functions as a controllable large resistor for reducing ringing.

Figure 23:
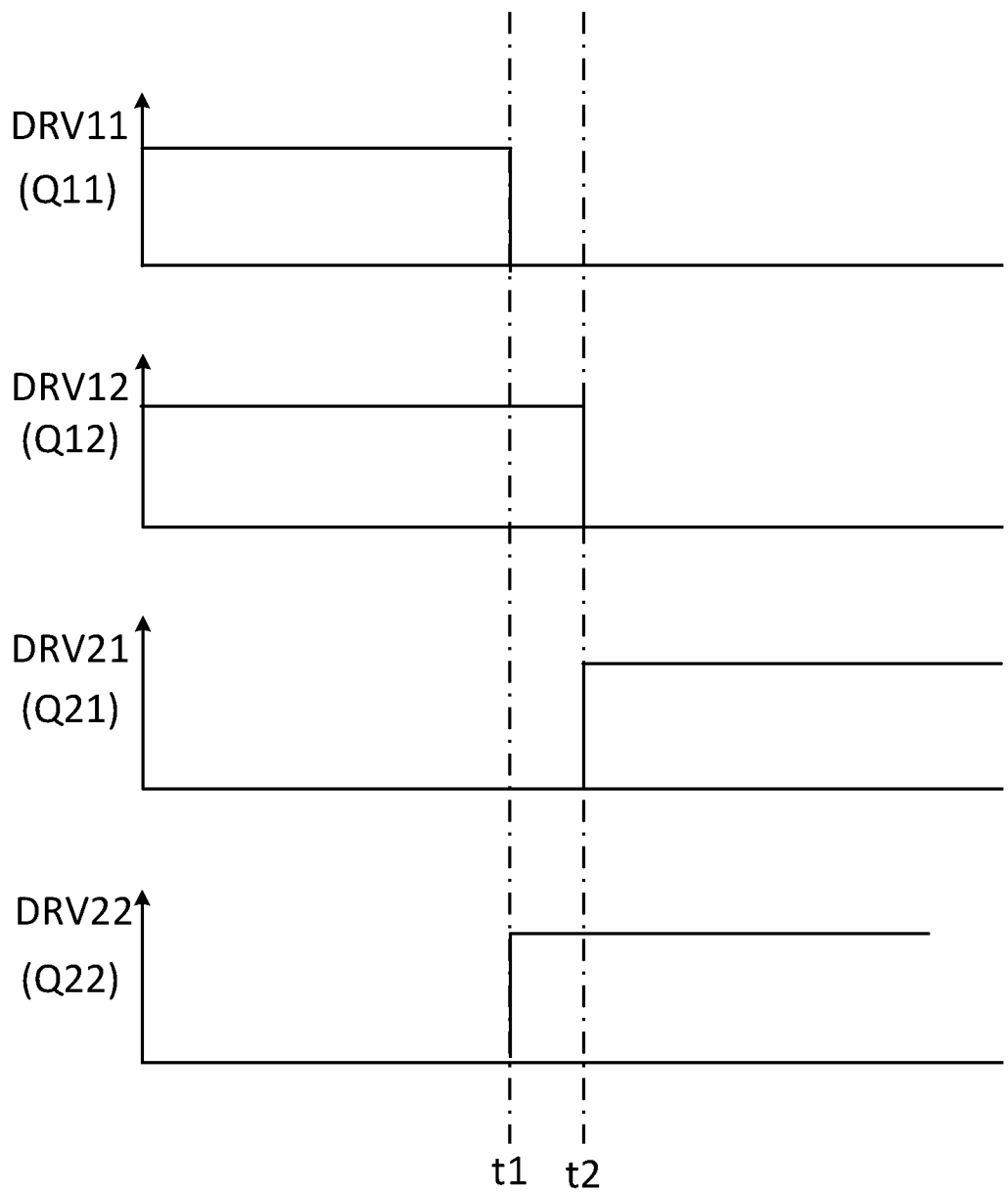
FIG. 23 illustrates a fifth implementation of the low-side turn-on control scheme applied to the step-down converter shown in FIG. 3 in accordance with various embodiments of the present disclosure.

FIG. 23 illustrates a fifth implementation of the low-side turn-on control scheme applied to the step-down converter shown in FIG. 3 in accordance with various embodiments of the present disclosure. The fifth implementation of the low-side turn-on control scheme shown in FIG. 23 is similar to that shown in FIG. 19 except that the second high-side switching element Q12 and the second low-side switching element Q22 are connected in series to form a large resistor during the turn-on transition of the low-side switch.

As shown in FIG. 23, at t1, the first high-side switching element Q11 is turned off. The second low-side switching element Q22 is turned on at t1. After a predetermined delay counting from t1, the first low-side switching element Q21 is turned on at t2, and the second high-side switching element Q12 is turned off at t2. During the predetermined delay (from t1 to t2), the second high-side switching element Q12 and the second low-side switching element Q22 are connected in series to form a controllable large resistor for reducing ringing.

It should be noted that the alignment between the turn-off time of Q12 and the turn-on time of Q21 is merely an example. Depending on different applications or design needs, the turn-off time of Q12 may be before or after the turn-on time of Q21.

Figure 24:
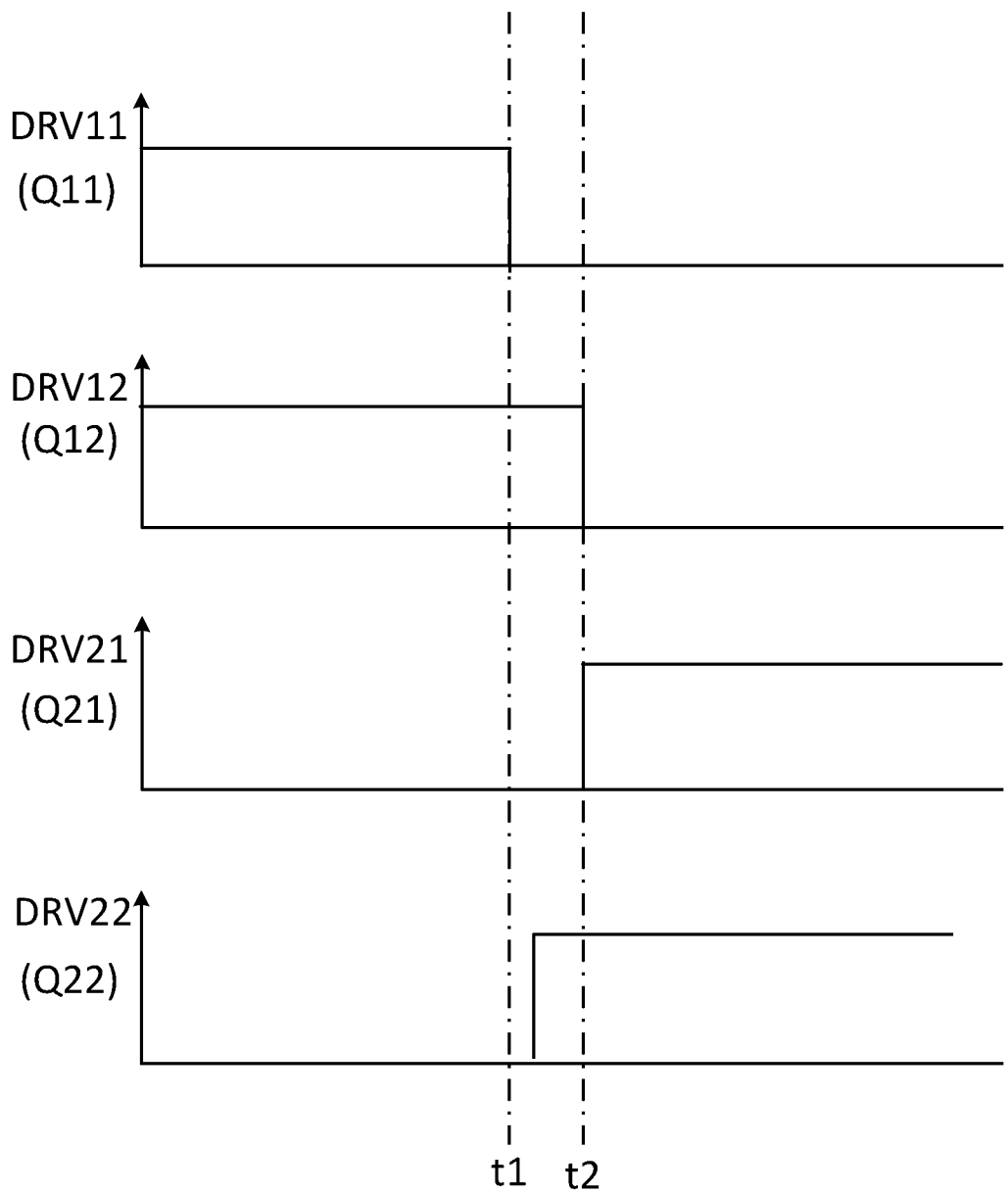
FIG. 24 illustrates a sixth implementation of the low-side turn-on control scheme applied to the step-down converter shown in FIG. 3 in accordance with various embodiments of the present disclosure.

FIG. 24 illustrates a sixth implementation of the low-side turn-on control scheme applied to the step-down converter shown in FIG. 3 in accordance with various embodiments of the present disclosure. The sixth implementation of the low-side turn-on control scheme shown in FIG. 24 is similar to that shown in FIG. 23 except that a predetermined dead time (from t1 to t2) is added.

As shown in FIG. 24, at t1, the first high-side switching element Q11 is turned off. A predetermined dead time (from t1 to t2) is placed between turning off the first high-side switching element Q11 and turning on the second low-side switching element Q22. As shown in FIG. 24, the second low-side switching element Q22 is turned on at t2. After a predetermined delay counting from t2, the first low-side switching element Q21 is turned on at t3, and the second high-side switching element Q12 is turned off at t3. During the predetermined delay (from t2 to t3), the second high-side switching element Q12 and the second low-side switching element Q22 are connected in series to form a controllable large resistor for reducing ringing.

It should be noted that the alignment between the turn-off time of Q12 and the turn-on time of Q21 is merely an example. Depending on different applications or design needs, the turn-off time of Q12 may be before or after the turn-on time of Q21.

Figure 25:
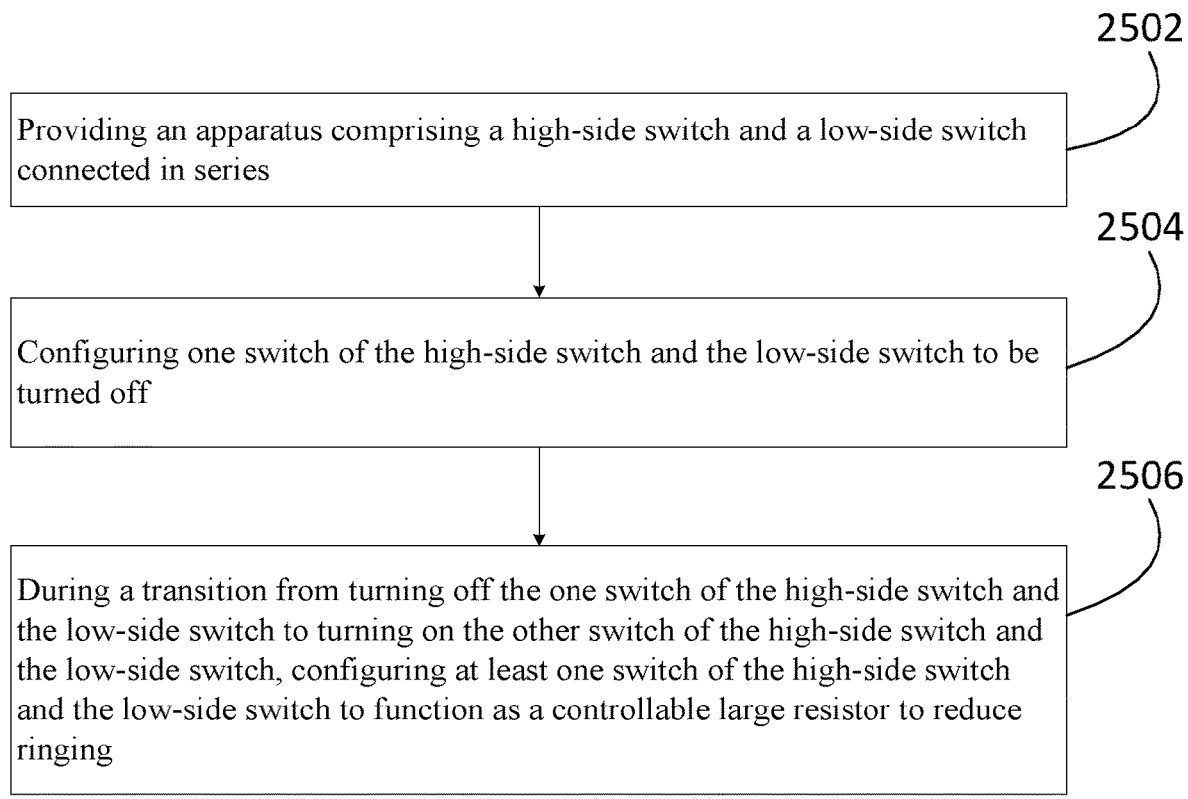
FIG. 25 illustrates a flow chart of controlling the step-down converter shown in FIG. 3 in accordance with various embodiments of the present disclosure.

FIG. 25 illustrates a flow chart of controlling the step-down converter shown in FIG. 3 in accordance with various embodiments of the present disclosure. This flowchart shown in FIG. 25 is merely an example, which should not unduly limit the scope of the claims. One of ordinary skill in the art would recognize many variations, alternatives, and modifications. For example, various steps illustrated in FIG. 25 may be added, removed, replaced, rearranged and repeated.

Referring back to FIG. 3, the step-down converter comprises a high-side switch 202 and a low-side switch 204 connected in series between the input voltage bus VIN and ground. The high-side switch 202 comprises a first high-side switching element Q11 and a second high-side switching element Q12 connected in parallel between VIN and the switching node SW. The first high-side switching element Q11 comprises a first number of high-side transistor cells connected in parallel. The second high-side switching element Q12 comprises a second number of high-side transistor cells connected in parallel. The low-side switch 204 comprises a first low-side switching element Q21 and a second low-side switching element Q22 connected in parallel between the switching node SW and ground. The first low-side switching element Q21 comprises a first number of low-side transistor cells connected in parallel. The second high-side switching element Q22 comprises a second number of low-side transistor cells connected in parallel.

At step 2502, an apparatus is provided. The apparatus comprises a high-side switch and a low-side switch connected in series.

At step 2504, one switch of the high-side switch and the low-side switch is configured to be turned off.

At step 2506, during a transition from turning off the one switch of the high-side switch and the low-side switch to turning on the other switch of the high-side switch and the low-side switch, at least one switch of the high-side switch and the low-side switch is configured to function as a controllable large resistor to reduce ringing.

The high-side switch comprises a first switching element comprising a first number of transistor cells connected in parallel, wherein gates of the first number of transistor cells are connected together, and the gates of the first number of transistor cells are configured to be connected to an output of a first gate drive circuit, and a second switching element comprising a second number of transistor cells connected in parallel, wherein gates of the second number of transistor cells are connected together, and the gates of the second number of transistor cells are configured to be connected to an output of a second gate drive circuit.

The low-side switch comprises a third switching element comprising a third number of transistor cells connected in parallel, wherein gates of the third number of transistor cells are connected together, and the gates of the third number of transistor cells are configured to be connected to an output of a third gate drive circuit, and a fourth switching element comprising a fourth number of transistor cells connected in parallel, wherein gates of the fourth number of transistor cells are connected together, and the gates of the fourth number of transistor cells are configured to be connected to an output of a fourth gate drive circuit.

Referring back to FIG. 13, the method further comprises during a turn-on process of the high-side switch, turning on the second switching element of the high-side switch once the low-side switch is turned off, and after a predetermined delay counting from a time instant at which the second switching element of the high-side switch is turned on, turning on the first switching element of the high-side switch, wherein during the predetermined delay, the second switching element of the high-side switch functions as the controllable large resistor.

Referring back to FIG. 14, the method further comprises during a turn-on process of the high-side switch, placing a predetermined dead time between turning off the low-side switch and turning on the second switching element of the high-side switch; and after a predetermined delay counting from a time instant at which the second switching element of the high-side switch is turned on, turning on the first switching element of the high-side switch, wherein during the predetermined delay, the second switching element of the high-side switch functions as the controllable large resistor.

Referring back to FIG. 15, the method further comprises during a turn-on process of the high-side switch, turning on the high-side switch once the third switching element of the low-side switch is turned off, and after a predetermined delay counting from a time instant at which the third switching element of the low-side switch is turned off, turning off the fourth switching element of the low-side switch, wherein during the predetermined delay, the fourth switching element of the low-side switch functions as the controllable large resistor.

Referring back to FIG. 16, the method further comprises during a turn-on process of the high-side switch, placing a predetermined dead time between turning off the third switching element of the low-side switch and turning on the high-side switch and, and after a predetermined delay counting from a time instant at which the third switching element of the low-side switch is turned off, turning off the fourth switching element of the low-side switch, wherein during the predetermined delay, the fourth switching element of the low-side switch functions as the controllable large resistor.

Referring back to FIG. 17, the method further comprises during a turn-on process of the high-side switch, turning on the second switching element of the high-side switch once the third switching element of the low-side switch is turned off, and after a predetermined delay counting from a time instant at which the third switching element of the low-side switch is turned off, turning off the fourth switching element of the low-side switch and turning on the first switching element of the high-side switch, wherein during the predetermined delay, the second switching element of the high-side switch and the fourth switching element of the low-side switch are connected in series to form the controllable large resistor.

Referring back to FIG. 18, the method further comprises during a turn-on process of the high-side switch, placing a predetermined dead time between turning off the third switching element of the low-side switch and turning on the second switching element of the high-side switch, and after a predetermined delay counting from a time instant at which the second switching element of the high-side switch is turned on, turning off the fourth switching element of the low-side switch and turning on the first switching element of the high-side switch, wherein during the predetermined delay, the second switching element of the high-side switch and the fourth switching element of the low-side switch are connected in series to form the controllable large resistor.

Referring back to FIG. 19, the method further comprises during a turn-on process of the low-side switch, turning on the fourth switching element of the low-side switch once the high-side switch is turned off, and after a predetermined delay counting from a time instant at which the fourth switching element of the low-side switch is turned on, turning on the third switching element of the low-side switch, wherein during the predetermined delay, the fourth switching element of the low-side switch functions as the controllable large resistor.

Referring back to FIG. 20, the method further comprises during a turn-on process of the low-side switch, placing a predetermined dead time between turning off the high-side switch and turning on the fourth switching element of the low-side switch, and after a predetermined delay counting from a time instant at which the fourth switching element of the low-side switch is turned on, turning on the third switching element of the low-side switch, wherein during the predetermined delay, the fourth switching element of the low-side switch functions as the controllable large resistor.

Referring back to FIG. 21, the method further comprises during a turn-on process of the low-side switch, turning on the low-side switch once the first switching element of the high-side switch is turned off, and after a predetermined delay counting from a time instant at which the first switching element of the high-side switch is turned off, turning off the second switching element of the high-side switch, wherein during the predetermined delay, the second switching element of the high-side switch functions as the controllable large resistor.

Referring back to FIG. 22, the method further comprises during a turn-on process of the low-side switch, placing a predetermined dead time between turning off the first switching element of the high-side switch and turning on the low-side switch, and after a predetermined delay counting from a time instant at which the first switching element of the high-side switch is turned off, turning off the second switching element of the high-side switch, wherein during the predetermined delay, the second switching element of the high-side switch functions as the controllable large resistor.

Referring back to FIG. 23, the method further comprises during a turn-on process of the low-side switch, turning on the fourth switching element of the low-side switch once the first switching element of the high-side switch is turned off, and after a predetermined delay counting from a time instant at which the first switching element of the high-side switch is turned off, turning off the second switching element of the high-side switch and turning on the third switching element of the low-side switch, wherein during the predetermined delay, the second switching element of the high-side switch and the fourth switching element of the low-side switch are connected in series to form the controllable large resistor.

Referring back to FIG. 24, the method further comprises during a turn-on process of the low-side switch, placing a predetermined dead time between turning off the first switching element of the high-side switch and turning on the fourth switching element of the low-side switch, and after a predetermined delay counting from a time instant at which the fourth switching element of the low-side switch is turned on, turning off the second switching element of the high-side switch and turning on the third switching element of the low-side switch, wherein during the predetermined delay, the second switching element of the high-side switch and the fourth switching element of the low-side switch are connected in series to form the controllable large resistor.

The first switching element comprises a first number of transistor cells connected in parallel. The second switching element comprises a second number of transistor cells connected in parallel. The third switching element comprises a third number of transistor cells connected in parallel. The fourth switching element comprises a fourth number of transistor cells connected in parallel. In some embodiments, the first number is greater than the second number, and the third number is greater than the fourth number.

Referring back to FIG. 3, the high-side switch, the low-side switch and an inductor form a step-down converter. The high-side switch and the low-side switch are connected in series between an input voltage bus and ground, and the inductor is connected between a common node of the high-side switch and the low-side switch, and an output bus of the step-down converter.

In accordance with an embodiment, a method comprises providing an apparatus comprising a high-side switch and a low-side switch connected in series, configuring one switch of the high-side switch and the low-side switch to be turned off, and during a transition from turning off the one switch of the high-side switch and the low-side switch and turning on the other switch of the high-side switch and the low-side switch, configuring at least one switch of the high-side switch and the low-side switch to function as a controllable large resistor to reduce ringing.

In accordance with another embodiment, a system comprises a high-side switch and a low-side switch connected in series between a first voltage bus and a second voltage bus, wherein the high-side switch comprises a first high-side switching element comprising a first number of high-side transistor cells connected in parallel, and a second high-side switching element comprising a second number of high-side transistor cells connected in parallel, and the low-side switch comprises a first low-side switching element comprising a first number of low-side transistor cells connected in parallel, and a second low-side switching element comprising a second number of low-side transistor cells connected in parallel, and a gate drive circuit configured to turn off one switch of the high-side switch and the low-side switch, and during a transition from turning off the one switch of the high-side switch and the low-side switch and turning on the other switch of the high-side switch and the low-side switch, configure at least one switch of the high-side switch and the low-side switch to function as a controllable large resistor to reduce ringing.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
providing an apparatus comprising a high-side switch and a low-side switch connected in series, wherein the high-side switch comprises a first switching element comprising a first number of transistor cells connected in parallel, and a second switching element comprising a second number of transistor cells connected in parallel; and the low-side switch comprises a third switching element comprising a third number of transistor cells connected in parallel, and a fourth switching element comprising a fourth number of transistor cells connected in parallel;
configuring one switch of the high-side switch and the low-side switch to be turned off; and
during a transition from turning off the one switch of the high-side switch and the low-side switch to turning on the other switch of the high-side switch and the low-side switch, configuring at least one switch of the high-side switch and the low-side switch to function as a controllable large resistor to reduce ringing.

2. The method of claim 1, wherein:
gates of the first number of transistor cells are connected together, and the gates of the first number of transistor cells are configured to be connected to an output of a first gate drive circuit;
gates of the second number of transistor cells are connected together, and the gates of the second number of transistor cells are configured to be connected to an output of a second gate drive circuit;
gates of the third number of transistor cells are connected together, and the gates of the third number of transistor cells are configured to be connected to an output of a third gate drive circuit; and
gates of the fourth number of transistor cells are connected together, and the gates of the fourth number of transistor cells are configured to be connected to an output of a fourth gate drive circuit.

3. The method of claim 2, further comprising:
during a turn-on process of the high-side switch, turning on the second switching element of the high-side switch once the low-side switch is turned off; and
after a predetermined delay counting from a time instant at which the second switching element of the high-side switch is turned on, turning on the first switching element of the high-side switch, wherein during the predetermined delay, the second switching element of the high-side switch functions as the controllable large resistor.

4. The method of claim 2, further comprising:
during a turn-on process of the high-side switch, placing a predetermined dead time between turning off the low-side switch and turning on the second switching element of the high-side switch; and
after a predetermined delay counting from a time instant at which the second switching element of the high-side switch is turned on, turning on the first switching element of the high-side switch, wherein during the predetermined delay, the second switching element of the high-side switch functions as the controllable large resistor.

5. The method of claim 2, further comprising:
during a turn-on process of the high-side switch, turning on the high-side switch once the third switching element of the low-side switch is turned off; and
after a predetermined delay counting from a time instant at which the third switching element of the low-side switch is turned off, turning off the fourth switching element of the low-side switch, wherein during the predetermined delay, the fourth switching element of the low-side switch functions as the controllable large resistor.

6. The method of claim 2, further comprising:
during a turn-on process of the high-side switch, placing a predetermined dead time between turning off the third switching element of the low-side switch and turning on the high-side switch and; and
after a predetermined delay counting from a time instant at which the third switching element of the low-side switch is turned off, turning off the fourth switching element of the low-side switch, wherein during the predetermined delay, the fourth switching element of the low-side switch functions as the controllable large resistor.

7. The method of claim 2, further comprising:
during a turn-on process of the high-side switch, turning on the second switching element of the high-side switch once the third switching element of the low-side switch is turned off; and
after a predetermined delay counting from a time instant at which the third switching element of the low-side switch is turned off, turning off the fourth switching element of the low-side switch and turning on the first switching element of the high-side switch, wherein during the predetermined delay, the second switching element of the high-side switch and the fourth switching element of the low-side switch are connected in series to form the controllable large resistor.

8. The method of claim 2, further comprising:
during a turn-on process of the high-side switch, placing a predetermined dead time between turning off the third switching element of the low-side switch and turning on the second switching element of the high-side switch; and
after a predetermined delay counting from a time instant at which the second switching element of the high-side switch is turned on, turning off the fourth switching element of the low-side switch and turning on the first switching element of the high-side switch, wherein during the predetermined delay, the second switching element of the high-side switch and the fourth switching element of the low-side switch are connected in series to form the controllable large resistor.

9. The method of claim 2, further comprising:
during a turn-on process of the low-side switch, turning on the fourth switching element of the low-side switch once the high-side switch is turned off; and
after a predetermined delay counting from a time instant at which the fourth switching element of the low-side switch is turned on, turning on the third switching element of the low-side switch, wherein during the predetermined delay, the fourth switching element of the low-side switch functions as the controllable large resistor.

10. The method of claim 2, further comprising:
during a turn-on process of the low-side switch, placing a predetermined dead time between turning off the high-side switch and turning on the fourth switching element of the low-side switch; and
after a predetermined delay counting from a time instant at which the fourth switching element of the low-side switch is turned on, turning on the third switching element of the low-side switch, wherein during the predetermined delay, the fourth switching element of the low-side switch functions as the controllable large resistor.

11. The method of claim 2, further comprising:
during a turn-on process of the low-side switch, turning on the low-side switch once the first switching element of the high-side switch is turned off; and
after a predetermined delay counting from a time instant at which the first switching element of the high-side switch is turned off, turning off the second switching element of the high-side switch, wherein during the predetermined delay, the second switching element of the high-side switch functions as the controllable large resistor.

12. The method of claim 2, further comprising:
during a turn-on process of the low-side switch, placing a predetermined dead time between turning off the first switching element of the high-side switch and turning on the low-side switch; and
after a predetermined delay counting from a time instant at which the first switching element of the high-side switch is turned off, turning off the second switching element of the high-side switch, wherein during the predetermined delay, the second switching element of the high-side switch functions as the controllable large resistor.

13. The method of claim 2, further comprising:
during a turn-on process of the low-side switch, turning on the fourth switching element of the low-side switch once the first switching element of the high-side switch is turned off; and
after a predetermined delay counting from a time instant at which the first switching element of the high-side switch is turned off, turning off the second switching element of the high-side switch and turning on the third switching element of the low-side switch, wherein during the predetermined delay, the second switching element of the high-side switch and the fourth switching element of the low-side switch are connected in series to form the controllable large resistor.

14. The method of claim 2, further comprising:
during a turn-on process of the low-side switch, placing a predetermined dead time between turning off the first switching element of the high-side switch and turning on the fourth switching element of the low-side switch; and
after a predetermined delay counting from a time instant at which the fourth switching element of the low-side switch is turned on, turning off the second switching element of the high-side switch and turning on the third switching element of the low-side switch, wherein during the predetermined delay, the second switching element of the high-side switch and the fourth switching element of the low-side switch are connected in series to form the controllable large resistor.

15. The method of claim 2, wherein:
the first number is greater than the second number; and
the third number is greater than the fourth number.

16. The method of claim 1, wherein the high-side switch, the low-side switch and an inductor form a step-down converter, and wherein:
the high-side switch and the low-side switch are connected in series between an input voltage bus and ground; and
the inductor is connected between a common node of the high-side switch and the low-side switch, and an output bus of the step-down converter.

17. A system comprising:
a high-side switch and a low-side switch connected in series between a first voltage bus and a second voltage bus, wherein:
the high-side switch comprises a first high-side switching element comprising a first number of high-side transistor cells connected in parallel, and a second high-side switching element comprising a second number of high-side transistor cells connected in parallel; and
the low-side switch comprises a first low-side switching element comprising a first number of low-side transistor cells connected in parallel, and a second low-side switching element comprising a second number of low-side transistor cells connected in parallel; and
a gate drive circuit configured to:
turn off one switch of the high-side switch and the low-side switch; and
during a transition from turning off the one switch of the high-side switch and the low-side switch to turning on the other switch of the high-side switch and the low-side switch, configure at least one switch of the high-side switch and the low-side switch to function as a controllable large resistor to reduce ringing.

18. The system of claim 17, wherein the gate drive circuit comprises:
a first high-side driver configured to provide a first high-side drive signal for the first number of high-side transistor cells in the first high-side switching element;
a second high-side driver configured to provide a second high-side drive signal for the second number of high-side transistor cells in the second high-side switching element;
a first low-side driver configured to provide a first low-side drive signal for the first number of low-side transistor cells in the first low-side switching element; and
a second low-side driver configured to provide a second low-side drive signal for the second number of low-side transistor cells in the second low-side switching element.

19. The system of claim 17, wherein:
during a turn-on process of the high-side switch, the second high-side switching element is turned on once the low-side switch is turned off; and
after a predetermined delay counting from a time instant at which the second high-side switching element is turned on, the first high-side switching element is turned on, and wherein during the predetermined delay, the second high-side switching element functions as the controllable large resistor.

20. The system of claim 17, wherein:
during a turn-on process of the low-side switch, the second low-side switching element is turned on once the high-side switch is turned off; and
after a predetermined delay counting from a time instant at which the second low-side switching element is turned on, the first low-side switching element is turned on, and wherein during the predetermined delay, the second low-side switching element functions as the controllable large resistor.

* * * * *